(12) United States Patent
Manabe

(10) Patent No.: US 9,070,582 B2
(45) Date of Patent: Jun. 30, 2015

(54) SEMICONDUCTOR DEVICE, METHOD OF FORMING SEMICONDUCTOR DEVICE, AND DATA PROCESSING SYSTEM

(75) Inventor: Kazutaka Manabe, Tokyo (JP)

(73) Assignee: PS4 LUXCO S.A.R.L., Luxembourg (LU)

( * ) Notice: Subject to any disclaimer, the term of this patent is extended or adjusted under 35 U.S.C. 154(b) by 487 days.

(21) Appl. No.: 13/287,496

(22) Filed: Nov. 2, 2011

(65) Prior Publication Data

US 2012/0112271 A1   May 10, 2012

(30) Foreign Application Priority Data

Nov. 5, 2010   (JP) .................................. 2010-249049

(51) Int. Cl.
*H01L 29/78*   (2006.01)
*H01L 27/108*   (2006.01)

(52) U.S. Cl.
CPC .... *H01L 27/10855* (2013.01); *H01L 27/10808* (2013.01); *H01L 27/10823* (2013.01); *H01L 27/10876* (2013.01)

(58) Field of Classification Search
CPC ................... H01L 27/10808; H01L 27/10876; H01L 27/10855; H01L 27/10823
USPC .................................................. 257/330–335
See application file for complete search history.

(56) References Cited

U.S. PATENT DOCUMENTS

| 8,409,955 B2 * | 4/2013 | Fujimoto | 438/270 |
| 2010/0219470 A1 * | 9/2010 | Baek | 257/334 |
| 2011/0143509 A1 * | 6/2011 | Fujimoto | 438/270 |

FOREIGN PATENT DOCUMENTS

| JP | 2003-060028 | 2/2003 |
| JP | 2008-300843 | 12/2008 |

* cited by examiner

*Primary Examiner* — Robert Carpenter

(57) ABSTRACT

A semiconductor device includes the following elements. A semiconductor substrate includes an isolation region. The semiconductor substrate has a groove in the isolation region. A pad electrode is disposed in the groove. A pad contact plug is disposed in the groove. The pad contact plug is disposed on the pad electrode. A gate contact plug is disposed on the pad contact plug. The gate contact plug is electrically coupled through the pad contact plug to the pad electrode. An insulating side wall is disposed in the groove. The insulating side wall covers side surfaces of the pad contact plug and a lower portion of the gate contact plug, and the insulating side wall covers a part of an upper surface of the pad electrode.

15 Claims, 37 Drawing Sheets

(C-C')

(A-A')

(A-A')

(A-A')

(B-B')

(C-C')

(A-A')

(A-A')

(B-B')

(C-C')

(A-A')

(B-B')

(C-C')

(A-A')

(B-B')

(C-C')

(A-A')

(B-B')

(C-C')

(A-A')

(C-C')

(A-A')

(C-C')

(A-A')

(C-C')

(A-A')

(A-A')

(C-C')

(A-A')

(C-C')

(A-A')

(C-C')

(A-A')

(C-C')

(Prior Art)

(Prior Art)

SEMICONDUCTOR DEVICE, METHOD OF FORMING SEMICONDUCTOR DEVICE, AND DATA PROCESSING SYSTEM

BACKGROUND OF THE INVENTION

1. Field of the Invention

The present invention relates to a semiconductor device, a method of fabricating the semiconductor device, and a data processing system.

Priority is claimed on Japanese Patent Application No. 2010-249049, filed Nov. 5, 2010, the content of which is incorporated herein by reference.

2. Description of the Related Art

With high integration of semiconductor devices, miniaturization of MOS transistors has progressed. In semiconductor devices having memory cell regions, e.g., dynamic random access memories (DRAMs), it is necessary to dispose MOS transistors in the memory cell regions with high density. As a structure of the MOS transistor appropriate to miniaturization and high density arrangement, technology in which a gate electrode is buried within a lower portion of a trench (groove) disposed in a semiconductor substrate, and an insulating film is covered within an upper portion of the trench has been disclosed in Japanese Patent Application Laid-Open No. 2008-300843.

As technology corresponding to high density arrangement of MOS transistors, technology in which an insulating film is formed on an inner wall of a contact hole in a sidewall shape has been disclosed in Japanese Patent Application Laid-Open No. 2003-060028.

SUMMARY

In one embodiment, a semiconductor device may include, but is not limited to, the following elements. A semiconductor substrate may include, but is not limited to, an isolation region. The semiconductor substrate has a groove in the isolation region. A pad electrode is disposed in the groove. A pad contact plug is disposed in the groove. The pad contact plug is disposed on the pad electrode. A gate contact plug is disposed on the pad contact plug. The gate contact plug is electrically coupled through the pad contact plug to the pad electrode. An insulating side wall is disposed in the groove. The insulating side wall covers side surfaces of the pad contact plug and a lower portion of the gate contact plug, and the insulating side wall covers a part of an upper surface of the pad electrode.

In another embodiment, a semiconductor device may include, but is not limited to, a semiconductor substrate comprising an active region and an isolation region, the semiconductor substrate having a groove, the groove including a first groove portion in the active region and a second groove portion in the isolation region; a buried gate electrode in the first groove portion; a pad electrode in the second groove portion, the pad electrode being electrically coupled to the buried gate electrode; a pad contact plug in the second groove portion, the pad contact plug being disposed over the pad electrode; and a gate contact plug disposed over the pad contact plug, the gate contact plug being electrically coupled through the pad contact plug to the pad electrode.

In still another embodiment, a semiconductor device may include, but is not limited to, a semiconductor substrate comprising a plurality of active regions and an isolation region defining the plurality of active regions, the semiconductor substrate having a groove, the groove including a first groove portion in the active region and a second groove portion in the isolation region, the second groove portion having a wider groove portion which is wider than the first groove portion and a narrower groove portion which is narrower than the wider groove portion; a buried gate electrode in the first groove portion; a pad electrode in the wider groove portion, the pad electrode being electrically coupled to the buried gate electrode; a pad contact plug in the wider groove portion, the pad contact plug being disposed over the pad electrode; a gate contact plug disposed over the pad contact plug, the gate contact plug being electrically coupled through the pad contact plug to the pad electrode, the gate contact plug being spatially separated from the pad electrode; an insulating side wall in the wider groove portion, the insulating side wall covering side surfaces of the pad contact plug and a lower portion of the gate contact plug, the insulating side wall covering a part of an upper surface of the pad electrode; and a cap insulating film in the first groove portion, the cap insulating film being disposed on the buried gate electrode.

In yet another embodiment, a method of forming a semiconductor device may include, but is not limited to, the following processes. An isolation region is formed in a semiconductor substrate to define an active region in the semiconductor substrate. A groove is formed in the semiconductor substrate. The groove extends in both the active region and the isolation region. The groove has a wider groove portion in the isolation region. A gate insulating film is formed in the groove. A first conductive film is formed on the gate insulating film so that the first conductive film fills the groove. The first conductive film is selectively removed to have the first conductive film remain in a lower portion of the groove, to form a buried gate electrode in the lower portion of the groove. A cap insulating film is formed in the groove, so that the cap insulating film fills up the groove except for the wider groove portion, and the cap insulating film fills partially the wider groove portion. The cap insulating film are etched back to form side walls covering inside wall of the wider groove portion and to have the cap insulating film remain in filling up the groove except for the wider groove portion. A pad contact plug is formed which fills the wider groove portion. An inter-layer insulating film is formed, which covers the pad contact plug and the cap insulating film. The gate contact plug is formed which penetrates the inter-layer insulating film. The gate contact plug is connected to the pad contact plug.

In an additional embodiment, a data processing system may include, but is not limited to, the semiconductor device in any embodiments.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Before describing the present invention, the related art will be explained in detail with reference to FIGS. 28, 29A, 29B, 29C, 29D, 30A, 30B and 30C, in order to facilitate the understanding of the present invention.

By examining a method of forming a MOS transistor having a structure in which a gate electrode is buried within a lower portion of a trench formed in a semiconductor substrate, the present inventor became aware of the following problems.

Figure 28:
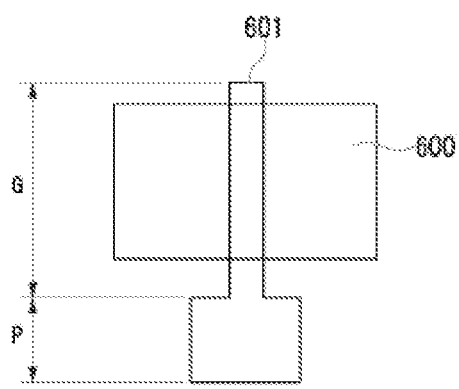
FIG. 28 is a fragmentary plan view of an example of placement of an active region and a gate electrode in the related art.

FIG. 28 is a schematic diagram of a general planar type MOS transistor, viewed in plan.

A gate electrode 601 is disposed to cross an active region 600 of a semiconductor substrate. The gate electrode 601 includes two portions, a region G having a predetermined gate length and crossing the active region, and a region P connected to a contact plug for applying a potential to the gate electrode 601. The region P is a portion referred to as a pad. In general, the region P is formed to have a larger width than the region G, by considering an effect of an alignment error when forming the contact plug.

Even when forming the gate electrode 601 of a trench structure, the arrangement of the gate electrode 601 as shown in FIG. 28 is used as is so that a trench corresponding to the region G and the region P is formed. It is possible to ensure a margin of the alignment error when forming a contact hole by providing the region P having a large width.

Since a width of the trench is different in the region G and the region P, it is difficult to uniformly fill the trench with a material of the gate electrode. That is, a phenomenon in which a thickness of the material of the gate electrode buried within the trench in the region P having the trench of a large width is thin compared to the region G, is likely to occur. Thus, when forming a contact plug connected to the region P, the contact plug penetrates a gate electrode in the trench by an overetching process when forming the contact hole, making it easy to cause a short circuit between the semiconductor substrate and the contact plug. Thereby, in the semiconductor device using the MOS transistor having the structure in which the gate electrode is buried within a lower portion of the trench, fabrication yield is likely to be reduced.

The short circuit by the over-etching process when forming the contact hole will be described in detail below.

Figure 29A:
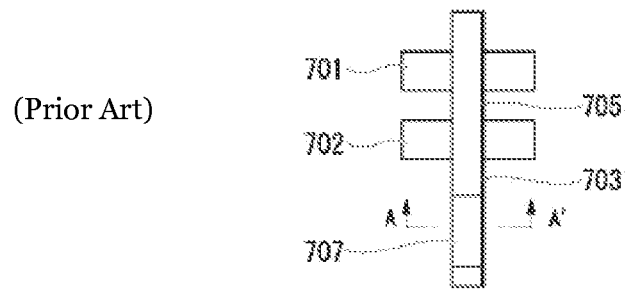
FIG. 29A is a fragmentary plan view of another example of placement of an active region and a gate electrode in the related art.
Figure 29B:
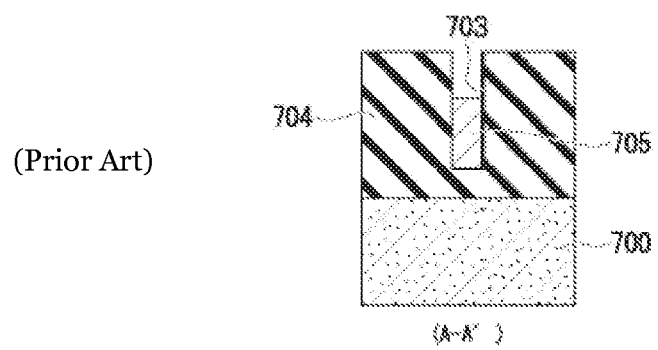
FIG. 29B is a fragmentary cross sectional elevation view, taken along an A-A' line of FIG. 20A, of a step involved in a method of forming a semiconductor device in the related art.
Figure 29C:
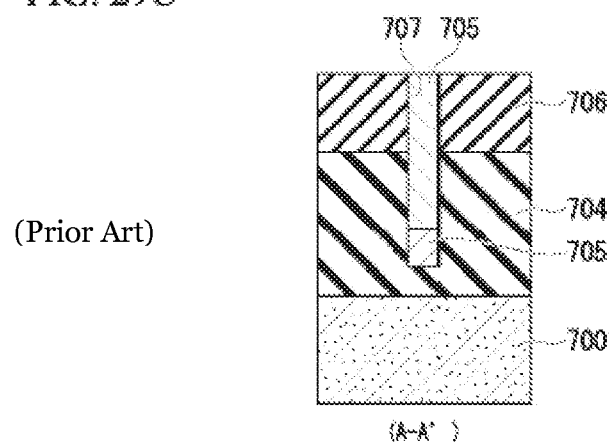
FIG. 29C is a fragmentary cross sectional elevation view, taken along an A-A' line of FIG. 20A, of a step subsequent to the step of FIG. 29B, involved in the method of forming the semiconductor device in the related art.

In a semiconductor device, a trench 703 having an uniform width is formed into a region of an element isolation film 704 around active regions 701 and 702 formed in a semiconductor substrate 700 to cross the active regions 701 and 702 as shown in FIG. 29A, a buried electrode layer 705 is formed within the trench 703 as shown in FIG. 29B, and an interlayer film 706 is formed and then a contact plug 707 is formed on a portion of the buried electrode layer 705 other than the active regions as shown in FIG. 29C.

Figure 29D:
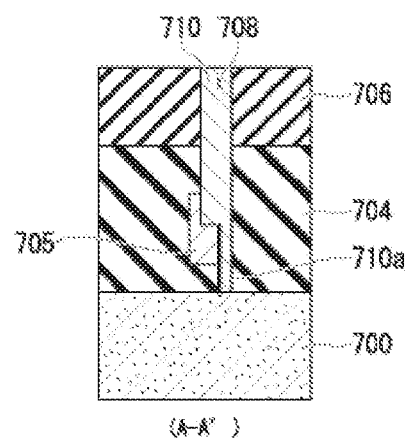
FIG. 29D is a fragmentary cross sectional elevation view, taken along an A-A' line of FIG. 20A, of another step subsequent to the step of FIG. 29B, involved in the method of forming the semiconductor device in the related art.

However, when a contact hole 708 is formed in the interlayer film 706 to apply the structure, if the contact hole 708 is misaligned as shown in FIG. 29D, a portion of the contact hole 708 deviates from a portion of the trench 703 and a portion of a side of the element isolation film 704 is aggressively etched, so that a portion of the contact hole 708 reaches the semiconductor substrate 700. When a contact plug 710 is formed in this state, a portion 710a of the contact plug 710 reaches the semiconductor substrate 700 causing the contact plug 710 and the semiconductor substrate 700 to be short-circuited.

Figure 30A:
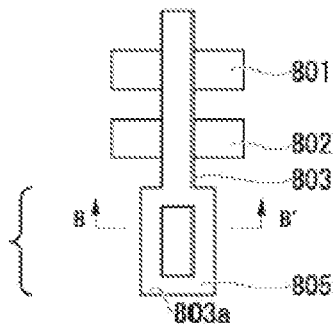
FIG. 30A is a fragmentary plan view of still another example of placement of an active region and a gate electrode in the related art.
Figure 30B:
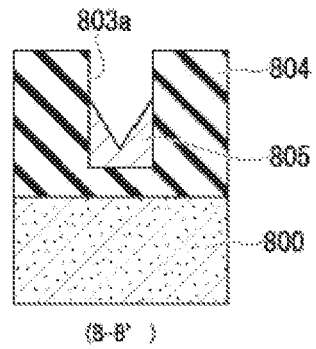
FIG. 30B is a fragmentary cross sectional elevation view, taken along a B-B' line of FIG. 30A, of a step involved in the method of forming the semiconductor device in the related art.
Figure 30C:
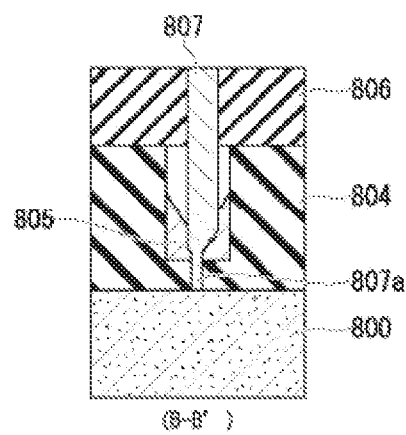
FIG. 30C is a fragmentary cross sectional elevation view, taken along a B-B' line of FIG. 30A, of a step subsequent to the step of FIG. 30B, involved in the method of forming the semiconductor device in the related art.

Thus, as shown in FIG. 30A, when a trench 803 is formed into a region of an element isolation film 804 around active regions 801 and 802 formed in a semiconductor substrate 800 to cross the active regions 801 and 802, and a width extension unit 803a is formed in the trench 803 in an outer side of the active regions 801 and 802, the above described deviation due to misalignment, and the like, is absorbed and a short circuit may prevented.

However, when a buried electrode layer 805 is formed within the trench 803 as described above and shown in FIG. 30C, an interlayer film 806 is formed and then a contact plug 807 connected to a portion of the buried electrode layer 805 other than the active regions is formed, the following problems are caused.

A phenomenon in which a buried gate electrode material at the central portion of the buried electrode layer 805 formed in a portion of the width extension unit 803a is thinner than a buried gate electrode material in a portion of the trench 803 having a small width, is likely to occur. Thus, when the contact plug 807 connected to the width extension unit 803a is formed, a contact hole penetrates the thin portion of the buried electrode layer 805 in the trench by an overetching process when forming the contact hole and a portion of the contact hole is formed therein. Therefore, a problem in which a portion 807a of the contact plug 807 formed therein reaches the semiconductor substrate 800 and a short circuit is caused, is likely to occur. Further, when forming the contact hole, it seems to be preferable that the contact hole process be performed by strictly controlling an etching condition, thereby preventing penetration of the contact hole. However, when the interlayer film 806 is further formed on the element isolation film 804 and then a deep etching process is performed to reach the buried electrode layer 805, if there is not enough etching, an interlayer film is left on the buried electrode layer 805 to cause a contact failure of the contact plug 807. Thus, it is likely that an over-etching process is performed to obtain certain conduction, which tends to be problematic.

Embodiments of the invention will be now described herein with reference to illustrative embodiments. Those skilled in the art will recognize that many alternative embodiments can be accomplished using the teaching of the embodiments of the present invention and that the invention is not limited to the embodiments illustrated for explanatory purpose.

In one embodiment, a semiconductor device may include, but is not limited to, the following elements. A semiconductor substrate may include, but is not limited to, an isolation region. The semiconductor substrate has a groove in the isolation region. A pad electrode is disposed in the groove. A pad contact plug is disposed in the groove. The pad contact plug is disposed on the pad electrode. A gate contact plug is disposed on the pad contact plug. The gate contact plug is electrically coupled through the pad contact plug to the pad electrode. An insulating side wall is disposed in the groove. The insulating side wall covers side surfaces of the pad contact plug and a lower portion of the gate contact plug, and the insulating side wall covers a part of an upper surface of the pad electrode.

In some cases, the semiconductor substrate may further include an active region. The groove includes a first groove portion in the active region and a second groove portion in the isolation region.

In some cases, the semiconductor device may further include a buried gate electrode in the first groove portion.

In some cases, the pad electrode is deposed in the second groove portion. The pad electrode is electrically coupled to the buried gate electrode. The pad contact plug is deposed in the second groove portion, the pad contact plug is disposed over the pad electrode. The gate contact plug is disposed over the pad contact plug. The gate contact plug is electrically coupled through the pad contact plug to the pad electrode. The gate contact plug is spatially separated from the pad electrode by the pad contact plug.

In some cases, the gate contact plug has a bottom portion which is higher in level than a top portion of the pad electrode.

In some cases, the semiconductor device may further include, but is not limited to, an inter-layer insulating film over the isolation region. The gate contact plug penetrates the inter-layer insulating film. The gate contact plug has a bottom portion which is positioned in an upper portion of the second groove portion.

In some cases, the semiconductor device may further include, but is not limited to, an interconnect over the inter-layer insulating film. The interconnect is electrically coupled through the gate contact plug to the pad contact plug.

In some cases, the insulating side wall covers a part of an upper surface of the pad electrode.

In some cases, the semiconductor device may further include, but is not limited to, a cap insulating film in the first groove portion, the cap insulating film being disposed on the buried gate electrode.

In some cases, the insulating film side wall and the cap insulating film are first and second portions of an insulating film in the groove, respectively.

In some cases, the second groove portion has a wider groove portion which is wider than the first groove portion. The pad contact plug and the insulating film side wall are disposed within the wider groove portion.

In some cases, the second groove portion has a narrower groove portion which is narrower than the wider groove portion, and the pad electrode has a first thickness in the narrower groove portion and a second thickness in the wider groove portion, and the second thickness is smaller than the first thickness.

In some cases, the semiconductor device may further include, but is not limited to, a gate insulating film in the first groove portion, the gate insulating film separating the buried gate electrode from the semiconductor substrate.

In some cases, the semiconductor device may further include, but is not limited to, source and drain regions in the active region, the source and drain regions being disposed in opposite sides of the buried gate electrode and the gate insulating film.

In some cases, the buried gate electrode extends across the active region, the buried gate electrode reaches the isolation region, and the buried gate electrode has a wider gate electrode portion at its one end in the isolation region, and the wider gate electrode portion is positioned in the wider groove portion.

In another embodiment, a semiconductor device may include, but is not limited to, a semiconductor substrate comprising an active region and an isolation region, the semiconductor substrate having a groove, the groove including a first groove portion in the active region and a second groove portion in the isolation region; a buried gate electrode in the first groove portion; a pad electrode in the second groove portion, the pad electrode being electrically coupled to the buried gate electrode; a pad contact plug in the second groove portion, the pad contact plug being disposed over the pad electrode; and a gate contact plug disposed over the pad contact plug, the gate contact plug being electrically coupled through the pad contact plug to the pad electrode.

In some cases, the pad contact plug spatially separates the gate contact plug from the pad electrode.

In still another embodiment, a semiconductor device may include, but is not limited to, a semiconductor substrate comprising a plurality of active regions and an isolation region defining the plurality of active regions, the semiconductor substrate having a groove, the groove including a first groove portion in the active region and a second groove portion in the isolation region, the second groove portion having a wider groove portion which is wider than the first groove portion and a narrower groove portion which is narrower than the wider groove portion; a buried gate electrode in the first groove portion; a pad electrode in the wider groove portion, the pad electrode being electrically coupled to the buried gate electrode; a pad contact plug in the wider groove portion, the pad contact plug being disposed over the pad electrode; a gate contact plug disposed over the pad contact plug, the gate contact plug being electrically coupled through the pad contact plug to the pad electrode, the gate contact plug being spatially separated from the pad electrode; an insulating side wall in the wider groove portion, the insulating side wall covering side surfaces of the pad contact plug and a lower portion of the gate contact plug, the insulating side wall covering a part of an upper surface of the pad electrode; and a cap insulating film in the first groove portion, the cap insulating film being disposed on the buried gate electrode.

In some cases, the semiconductor device may include, but is not limited to, an inter-layer insulating film over the isolation region, wherein the gate contact plug penetrates the inter-layer insulating film, the gate contact plug has a bottom portion which is positioned in an upper portion of the second groove portion; and an interconnect over the inter-layer insulating film, the interconnect being electrically coupled through the gate contact plug to the pad contact plug.

In some cases, the semiconductor device may include, but is not limited to, a gate insulating film in the first groove portion, the gate insulating film separating the buried gate electrode from the semiconductor substrate; source and drain regions in the active region, the source and drain regions being disposed in opposite sides of the buried gate electrode and the gate insulating film; a word line which includes the buried gate electrode; and a capacitor electrically coupled to one of the source and drain regions.

In yet another embodiment, a method of forming a semiconductor device may include, but is not limited to, the following processes. An isolation region is formed in a semiconductor substrate to define an active region in the semiconductor substrate. A groove is formed in the semiconductor substrate. The groove extends in both the active region and the isolation region. The groove has a wider groove portion in the isolation region. A gate insulating film is formed in the groove. A first conductive film is formed on the gate insulating film so that the first conductive film fills the groove. The first conductive film is selectively removed to have the first conductive film remain in a lower portion of the groove, to form a buried gate electrode in the lower portion of the groove. A cap insulating film is formed in the groove, so that the cap insulating film fills up the groove except for the wider groove portion, and the cap insulating film fills partially the wider groove portion. The cap insulating film are etched back to form side walls covering inside wall of the wider groove portion and to have the cap insulating film remain in filling up the groove except for the wider groove portion. A pad contact plug is formed which fills the wider groove portion. An inter-layer insulating film is formed, which covers the pad contact plug and the cap insulating film. The gate contact plug is formed which penetrates the inter-layer insulating film. The gate contact plug is connected to the pad contact plug.

In some cases, the semiconductor device may further include, but is not limited to, introducing, before forming the groove, an impurity into the semiconductor substrate to form source and drain regions in the active region.

In some cases, the semiconductor device may further include, but is not limited to, introducing, after forming the pad contact plug, an impurity into the semiconductor substrate to form source and drain regions in the active region.

In some cases, the semiconductor device may further include, but is not limited to, forming a diffusion contact plug penetrating the inter-layer insulating film, the diffusion contact plug being connected to one of the source an drain regions.

In some cases, forming the pad contact plug may further include, but is not limited to, forming a conductive film; and etching back the conductive film to have the conductive film remain only in the wider groove portion.

In an additional embodiment, a data processing system may include, but is not limited to, the semiconductor device in any embodiments.

FIRST EMBODIMENT

An example of forming an n-channel MOS transistor according to a first embodiment of the present invention will be described with reference to FIGS. 1A to 14C.

In this embodiment, with respect to a semiconductor substrate 111 illustrated in FIGS. 1A and 1B, a method which will be described below based on FIGS. 2 to 14C may be performed to fabricate a MOS transistor having a structure illustrated in FIGS. 14A to 14C.

Figure 1A:
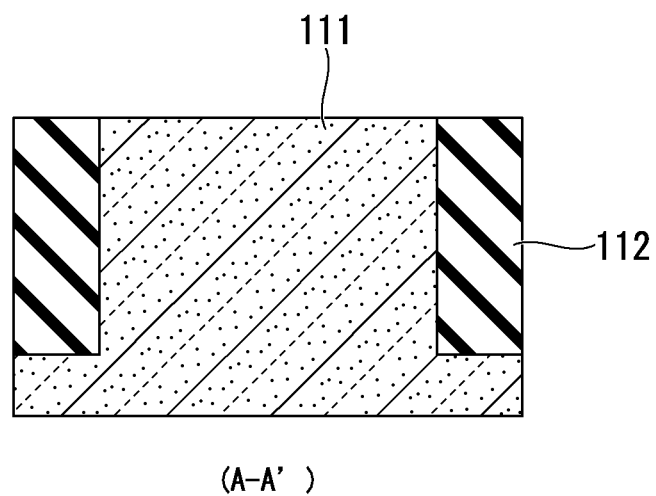
FIG. 1A is a fragmentary cross sectional elevation view, taken along an A-A' line of FIG. 1B, of a step involved in a method of forming a semiconductor device in accordance with one or more preferred embodiment of the present invention.
Figure 1B:
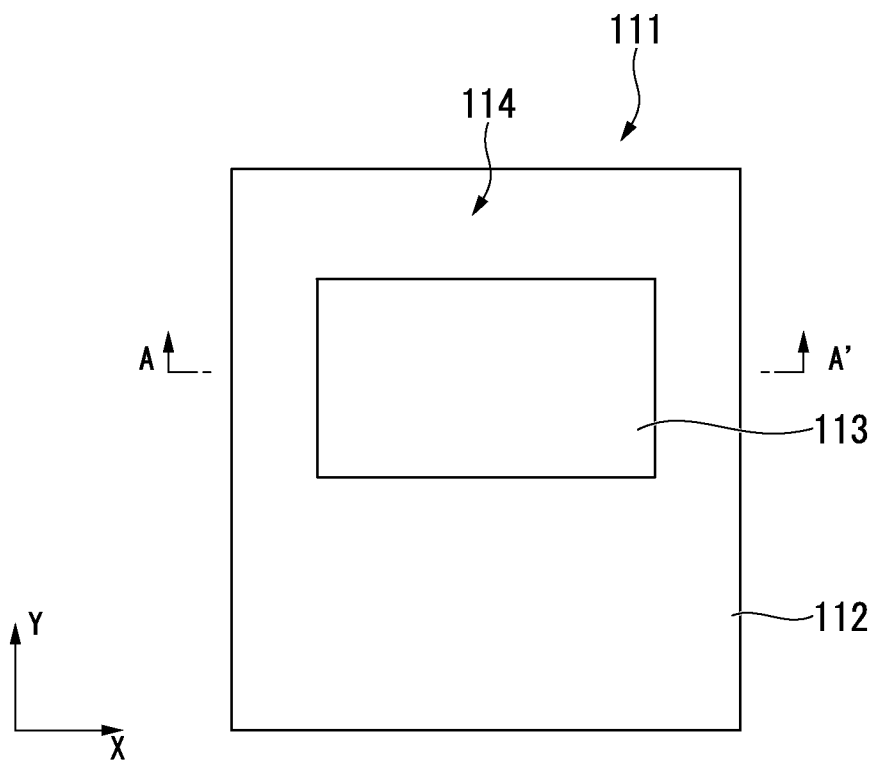
FIG. 1B is a fragmentary plan view of the step of FIG. 1A in accordance with one or more preferred embodiment of the present invention.
Figure 3A:
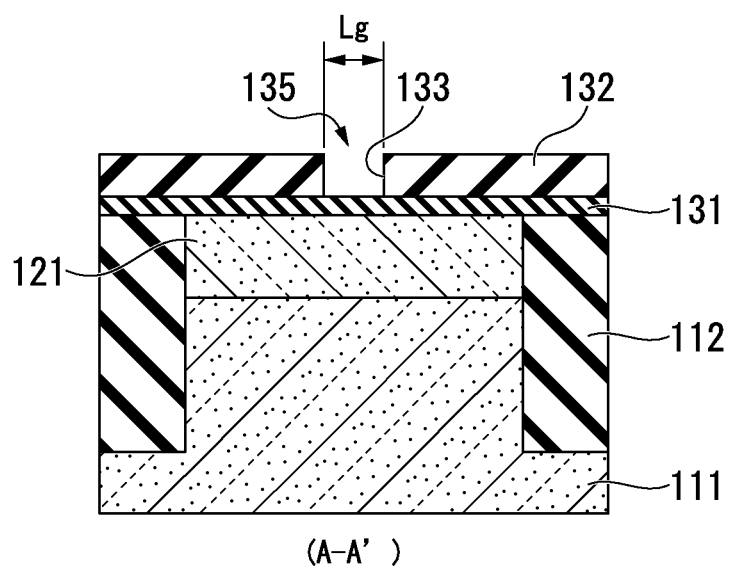
FIG. 3A is a fragmentary cross sectional elevation view, taken along an A-A' line of FIG. 3D, of a step, subsequent to the step of FIG. 2 involved in the method of forming the semiconductor device in accordance with one or more preferred embodiment of the present invention.
Figure 3B:
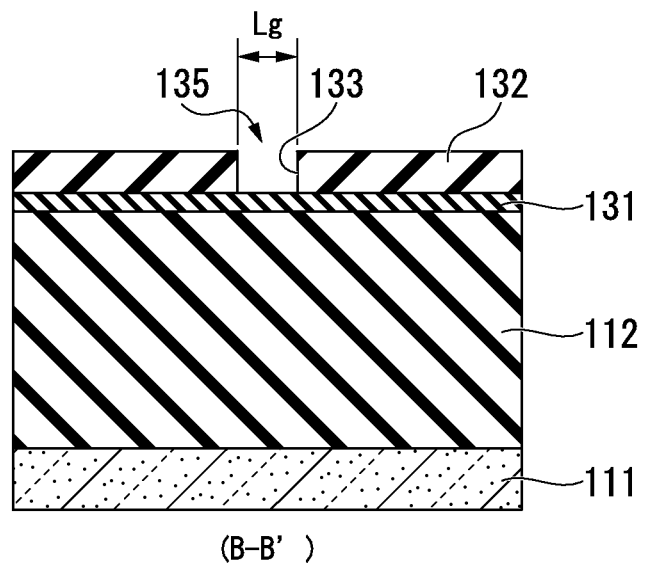
FIG. 3B is a fragmentary cross sectional elevation view, taken along a B-B' line of FIG. 3D, of the same step as of FIG. 3A, subsequent to the step of FIG. 2A involved in the method of forming the semiconductor device in accordance with one or more preferred embodiment of the present invention.
Figure 3C:
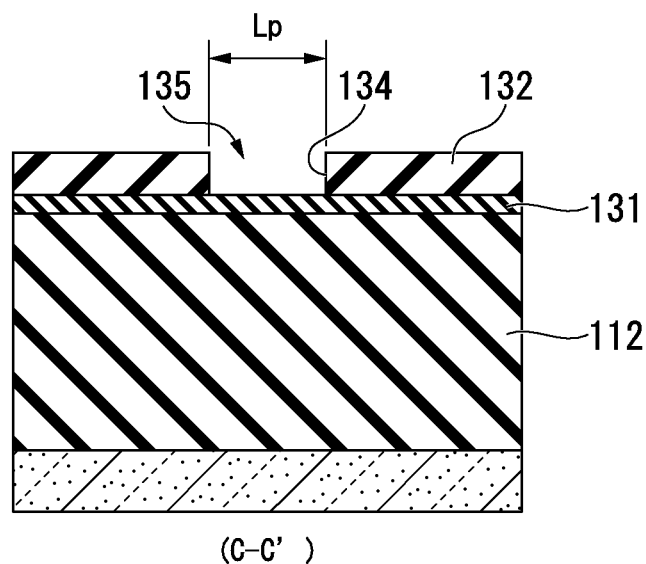
FIG. 3C is a fragmentary cross sectional elevation view, taken along a C-C' line of FIG. 3D, of the same step as of FIG. 3A, subsequent to the step of FIG. 2A involved in the method of forming the semiconductor device in accordance with one or more preferred embodiment of the present invention.
Figure 3D:
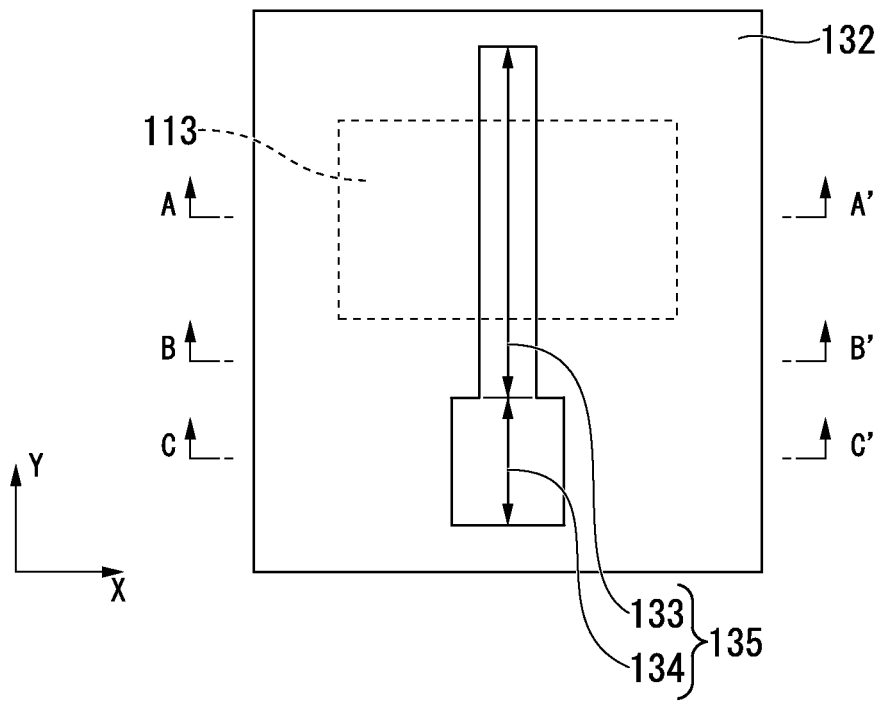
FIG. 3D is a fragmentary plan view of the step of FIGS. 3A to 3C in accordance with one or more preferred embodiment of the present invention.

For clarity, as shown in FIGS. 1B and 3D, an X direction and a Y direction are defined to be in a plane parallel to the semiconductor substrate 111 and are mutually orthogonal.

In this embodiment, as shown in FIGS. 1A and 1B, when the semiconductor substrate 111, such as a P type silicon substrate, is provided, an element isolation film 112 for defining an active region 113, which is formed of an insulating film such as a silicon oxide ($SiO_2$) film, is formed to be buried in a surface (a main surface) of the semiconductor substrate 111 by a known shallow trench isolation (STI) method, or the like. For example, when the semiconductor substrate 111 is viewed in plan, the element isolation film 112 is formed to be disposed around the rectangular-shaped active region 113 of FIG. 1B.

A region defined by an element isolation region 114 including the element isolation film 112 becomes the active region 113 in which the MOS transistor is to be formed.

Figure 2:
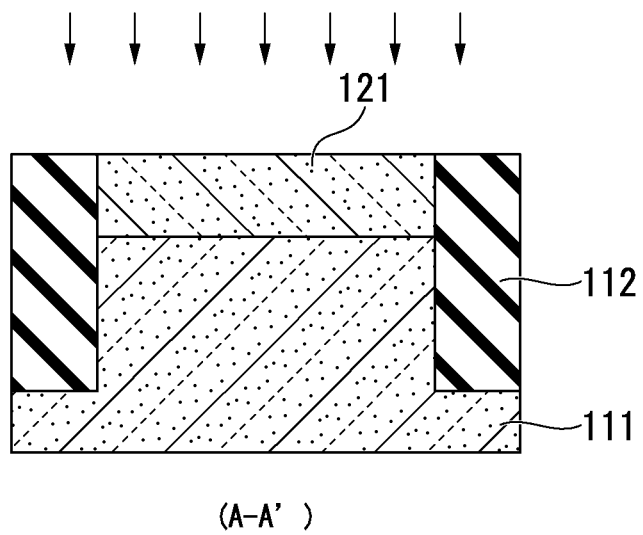
FIG. 2 is a fragmentary cross sectional elevation view, taken along an A-A' line of FIG. 1B, of a step, subsequent to the step of FIGS. 1A to 1B involved in the method of forming the semiconductor device in accordance with one or more preferred embodiment of the present invention.

As shown in FIG. 2, an N type diffusion layer 121 is formed in the surface of the semiconductor substrate 111 within the active region 113 by an ion implantation method. Conditions for forming the diffusion layer 121 in which phosphor (Ph) is used as an impurity, an energy is 80 keV, and a dose is $2 \times 10^{13}$ atoms/cm$^2$ may be taken as an example. The diffusion layer 121 is formed to a depth of about 100 nm.

As shown in FIGS. 3A to 3D, a protection film 131 is formed on the semiconductor substrate 111 and the element isolation film 112.

The protection film 131 may be formed of a silicon oxide film to a thickness of about 20 nm.

A resist mask 132 for forming a trench is formed on the semiconductor substrate 111. A resist opening 135 is formed in a corresponding portion of the resist mask 132 in which a trench is to be formed.

As shown in FIG. 3D, the resist opening 135 includes a gate opening 133 having a pattern shape extended and opened in the Y direction when viewed in plan and a rectangular-shaped pad opening 134. The pad opening 134 is formed to be connected to an edge portion of the gate opening 133 along the Y direction. The gate opening 133 is disposed to traverse the active region 113 of the transistor in the Y direction so that a central region of the gate opening 133 in the Y direction is positioned on the active region 113 and both side regions of the central region thereof along the Y direction are positioned on the element isolation film 112.

An opening width of the gate opening 133 in the X direction is denoted as Lg and an opening width of the pad opening 134 in the X direction is denoted as Lp. The pad opening 134 is a region to which a contact plug is to be connected in a subsequent process and is formed so that Lp is larger than Lg. Lg represents a gate length determined according to electrical characteristics required in the MOS transistor. In this embodiment, Lg may be 50 nm and Lp may be 150 nm.

The protection film 131 is etched using the resist mask 132 as a mask to expose the surface of the semiconductor substrate 111 within the active region 113, and the element isolation film 112 of the element isolation region 114.

Subsequently, the exposed semiconductor substrate 111 and the exposed element isolation film 112 are etched to form a trench. A trench 143 is formed in a portion opened by the resist opening 135 to extend from the active region 113 into the element isolation region 114. A trench formed under the gate opening 133 is referred to as a gate trench 141 and a trench formed under the pad opening 134 is referred to as a pad trench 142. Here, an etching process is performed so that a depth of the gate trench 141 (refer to FIG. 4A) formed in the semiconductor substrate 111 is substantially equal to depths of the gate trench 141 and pad trench 142 (refer to FIGS. 4B and 4C) formed in the element isolation film 112. Further, the depth of the trench formed in the element isolation film 112 is controlled to be positioned higher than a bottom surface of the element isolation film 112. Thereby, a width extension unit (pad trench) 142 corresponding to the pad opening 134 of the width Lp is formed in an edge portion of the trench 143 in an extension direction thereof (Y direction). The width extension unit 142 is formed to a larger width than the gate trench 141 on the active region 113 in a direction (X direction) orthogonal to a direction (Y direction) traversing the active region 113.

In this embodiment, the trench 143 is formed to a depth of about 150 nm in the semiconductor substrate 111 under the protection film 131 or a portion of the element isolation film 112.

Figure 4A:
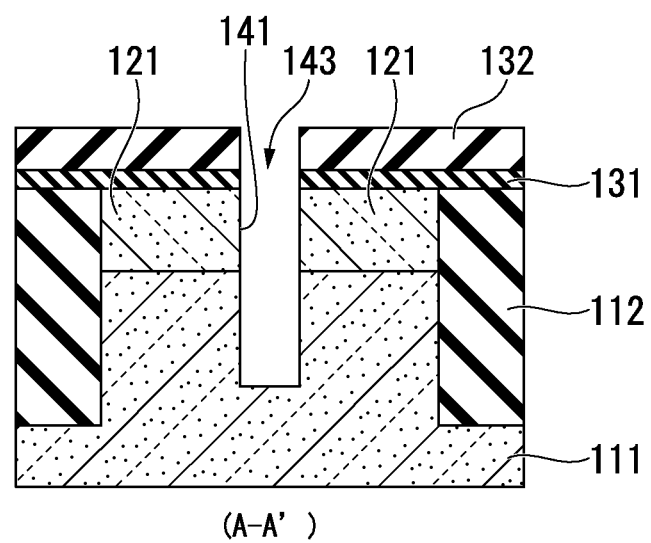
FIG. 4A is a fragmentary cross sectional elevation view, taken along an A-A' line of FIG. 3D, of a step, subsequent to the step of FIGS. 3A to 3D involved in the method of forming the semiconductor device in accordance with one or more preferred embodiment of the present invention.

By the formation of the trench 143, as shown in FIG. 4A, the diffusion layer 121 formed in the surface of the active region 113 is separated into left and right. Each separated diffusion layer 121 serves as either one of source and drain electrodes.

The resist mask 132 is removed. A gate insulating film 151 is formed on the exposed semiconductor substrate 111. The gate insulating film 151 may be formed to a thickness of about 5 nm by a thermal oxidation method. A formation material and a formation method of the gate insulating film 151 are not limited thereto. The gate insulating film 151 may be formed of a high dielectric film (high-k film) using a chemical vapor deposition (CVD) method or an atomic layer deposition (ALD) method.

A gate electrode film 152 is formed to fill the inside of the trench 143. The gate electrode film 152 may be formed in a structure of a stack film including a titanium nitride (TiN) film having a thickness of about 5 nm, and a tungsten (W) film having a thickness of about 100 nm.

The formation material of the gate electrode film 152 is not limited thereto, and may include a refractory metal film such as a TiN film, a Ti film or a W film, a silicon film containing an impurity (doped silicon film), or a stack film including the films. The gate electrode film 152 may be formed using a CVD method having good step coverage.

The thickness of the gate electrode film 152 which is 2 to 3 times or more the opening width of the trench 143 is necessary to fill the inside of the trench 143 so that a surface of the gate electrode film 152 is to be sufficiently planarized on the gate trench 141. For example, in this embodiment, the gate electrode film 152 has to be very thickly formed to a thickness of above about 300 nm to be planarized on the pad trench 142 having a large width. However, increase of the film thickness can cause drop in throughput of a film forming apparatus and increase in fabrication cost. Further, increasing the film thickness makes it more likely for a wafer to be warped by stress due to a deposited film, which may result in a substrate maintenance error in a vacuum check in a subsequent fabrication process. Due to this problem, it is difficult to form the gate electrode film 152 to a thickness sufficient to planarize an upper portion of the pad trench 142. Thus, it is preferable that a thickness sufficient to planarize only an upper portion of the gate trench 141 having a small width be set and the gate electrode film 152 be formed to the set thickness.

Figure 5A:
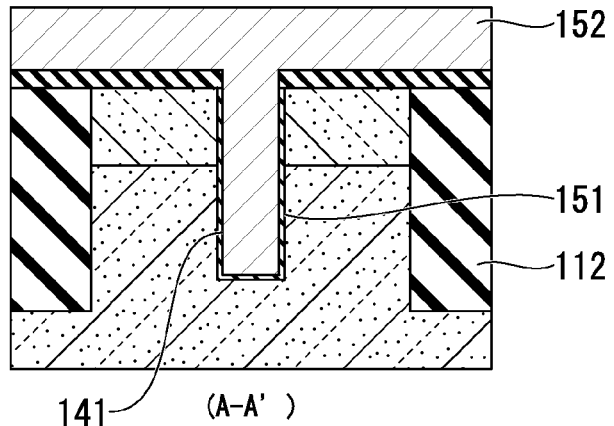
FIG. 5A is a fragmentary cross sectional elevation view, taken along an A-A' line of FIG. 3D, of a step, subsequent to the step of FIGS. 4A to 4C involved in the method of forming the semiconductor device in accordance with one or more preferred embodiment of the present invention.
Figure 5B:
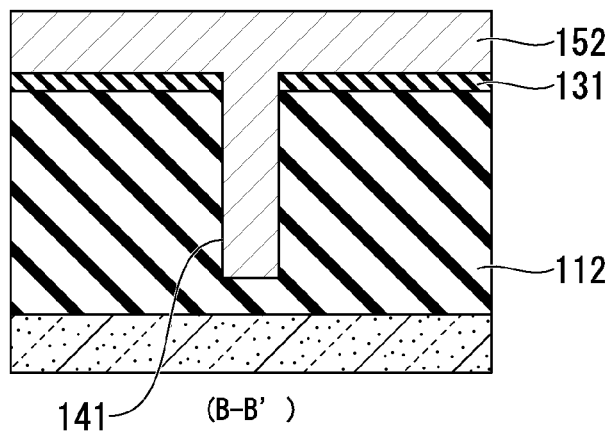
FIG. 5B is a fragmentary cross sectional elevation view, taken along a B-B' line of FIG. 3D, of the same step as of FIG. 5A, subsequent to the step of FIGS. 4A to 4C involved in the method of forming the semiconductor device in accordance with one or more preferred embodiment of the present invention.
Figure 5C:
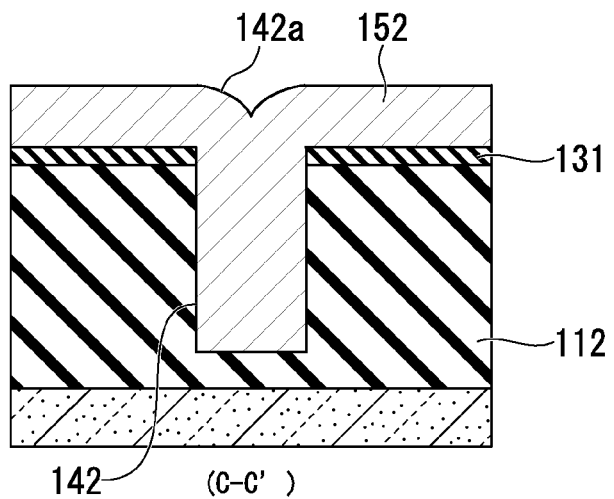
FIG. 5C is a fragmentary cross sectional elevation view, taken along a C-C' line of FIG. 3D, of the same step as of FIG. 5A, subsequent to the step of FIGS. 4A to 4C involved in the method of forming the semiconductor device in accordance with one or more preferred embodiment of the present invention.
Figure 6A:
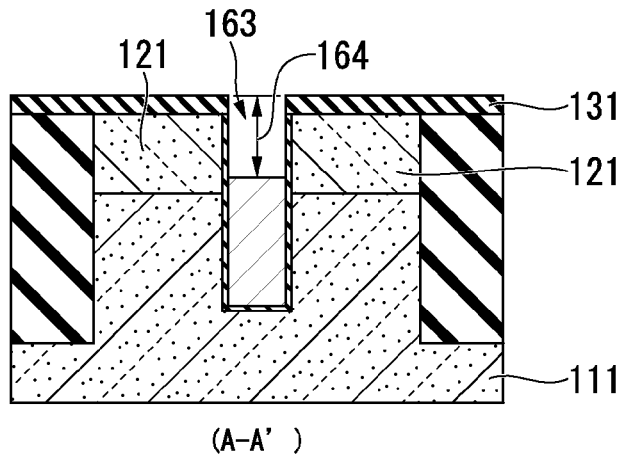
FIG. 6A is a fragmentary cross sectional elevation view, taken along an A-A' line of FIG. 3D, of a step, subsequent to the step of FIGS. 5A to 5C involved in the method of forming the semiconductor device in accordance with one or more preferred embodiment of the present invention.
Figure 6B:
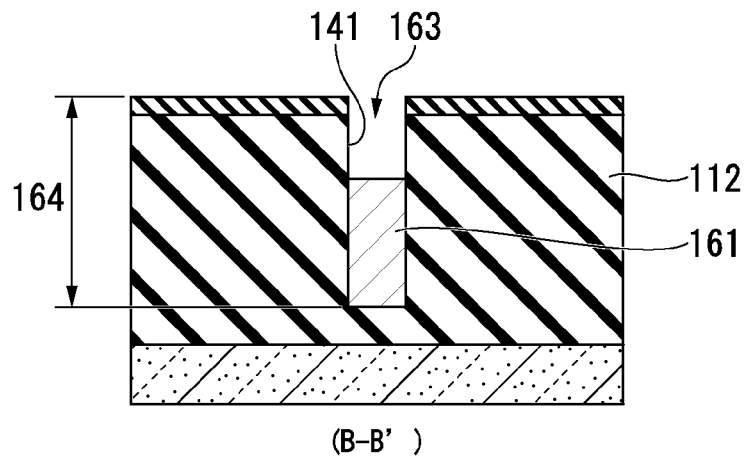
FIG. 6B is a fragmentary cross sectional elevation view, taken along a B-B' line of FIG. 3D, of the same step as of FIG. 6A, subsequent to the step of FIGS. 5A to 5C involved in the method of forming the semiconductor device in accordance with one or more preferred embodiment of the present invention.
Figure 6C:
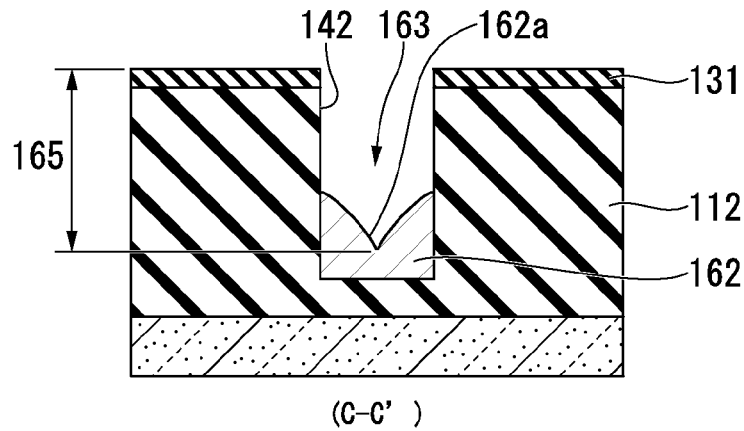
FIG. 6C is a fragmentary cross sectional elevation view, taken along a C-C' line of FIG. 3D, of the same step as of FIG. 6A, subsequent to the step of FIGS. 5A to 5C involved in the method of forming the semiconductor device in accordance with one or more preferred embodiment of the present invention.

As shown in FIG. 5C, in the pad trench 142, a concave unit 142a may be formed in the upper portion of the pad trench 142 due to insufficient thickness of the gate electrode film 152.

The gate electrode film 152 is etched-back to be buried within the trench 143. An electrode formed in the gate trench 141 is referred to as a gate electrode 161 and an electrode formed in the pad trench 142 is referred to as a pad electrode 162.

A transistor in which the gate electrode 161 serves as a gate electrode of a MOS transistor, an inner surface of the gate trench 141 is a channel region, and the diffusion layers 121 separated into left and right by the trench are source and drain electrodes is formed.

The gate electrode film 152 is etched downwardly so that an upper surface of the gate electrode 161 buried within the trench 141 is positioned lower than a main surface of the semiconductor substrate 111 and a space (referred to as a recess unit 163) surrounded by the upper surface of the gate electrode 161 and a sidewall of the trench 141 is formed. Thus, the pad electrode 162 which is a buried gate electrode formed in the width extension unit (pad trench) 142 is formed to be thinner than the buried gate electrode 161 formed in the trench 141 on the element isolation film 112.

A capping insulating film 171 is buried in the recess unit 163 in a subsequent process to ensure insulation endurance between a contact plug or an interconnection to be formed on the semiconductor substrate 111 and the gate electrode.

Since the gate electrode 161 is buried within the semiconductor substrate 111, processibility of the contact plug and the interconnection formed on the semiconductor substrate is improved compared to the related art. That is, when forming the contact plugs connected to the source and drain electrodes (diffusion layers 121), since it is unnecessary to dispose the contact plug away from the gate electrode as in the planar type of the related art, a margin of a location in which the contact plugs are disposed is increased. In addition, a short circuit between the gate electrode and the contact plug can be suppressed.

In this embodiment, the gate electrode 161 is formed so that the upper surface of the gate electrode 161 is positioned about 50 nm or more lower than the main surface of the semiconductor substrate 111, about 70 nm lower than a surface of the protection film 131. A distance from the surface of the semiconductor substrate 111, the surface of the protection film 131, to the upper surface of the gate electrode is referred to as a recess depth 164.

The recess unit 163 having a depth, recess depth 165, larger than the recess depth 164 of the gate electrode is formed on the pad electrode 162. As mentioned in the description of FIG. 5C, this is because after the gate electrode film 152 is formed, an upper portion of the pad trench 142 becomes concave. Further, an etching rate of the gate electrode film 152 is slow within the gate trench 141 having a small trench width by a micro-loading effect in etching. Due to this factor, a concave unit 162a is formed in a central portion thereof so that the thickness of the pad electrode 162 remains thinner than the gate electrode 161.

Figure 7A:
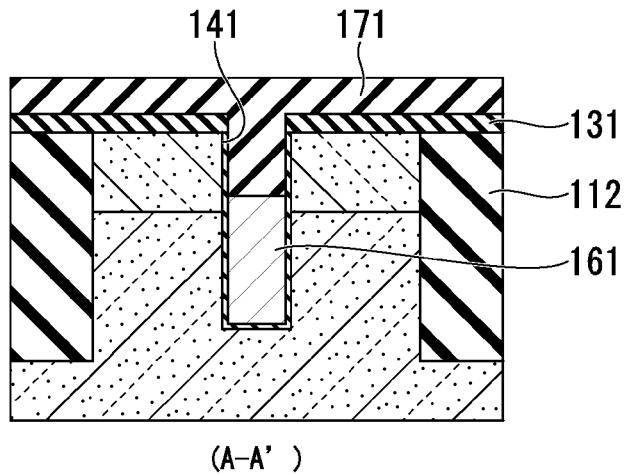
FIG. 7A is a fragmentary cross sectional elevation view, taken along an A-A' line of FIG. 3D, of a step, subsequent to the step of FIGS. 6A to 6C involved in the method of forming the semiconductor device in accordance with one or more preferred embodiment of the present invention.
Figure 7B:
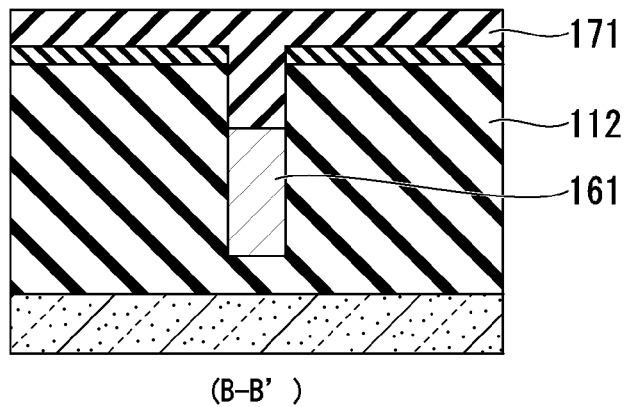
FIG. 7B is a fragmentary cross sectional elevation view, taken along a B-B' line of FIG. 3D, of the same step as of FIG. 7A, subsequent to the step of FIGS. 6A to 6C involved in the method of forming the semiconductor device in accordance with one or more preferred embodiment of the present invention.
Figure 7C:
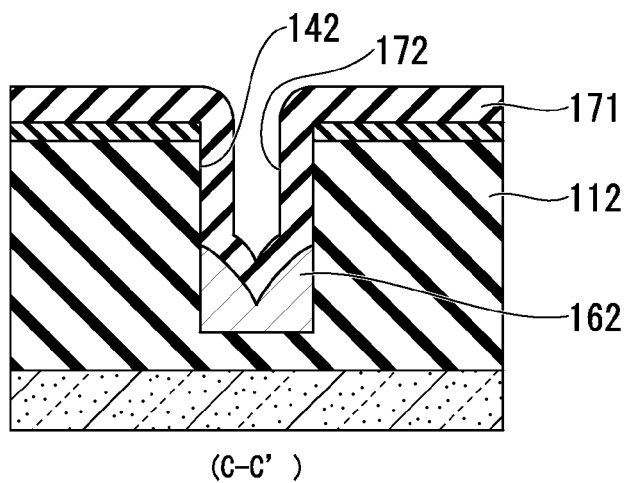
FIG. 7C is a fragmentary cross sectional elevation view, taken along a C-C' line of FIG. 3D, of the same step as of FIG. 7A, subsequent to the step of FIGS. 6A to 6C involved in the method of forming the semiconductor device in accordance with one or more preferred embodiment of the present invention.

As shown in FIGS. 7A to 7C, the capping insulating film 171 is formed by controlling a thickness thereof so that the capping insulating film 171 is buried within the recess unit 163 on the gate electrode 161, while the capping insulating film 171 is not entirely buried within the recess unit 163 on the pad electrode 162. In the recess unit 163 on the pad electrode 162, a hollow unit 172 is formed in the capping insulating film 171.

In this embodiment, the capping insulating film 171 is formed to a thickness of 40 nm of a silicon oxide film as a formation material thereof using a CVD method as a deposition method.

Figure 8A:
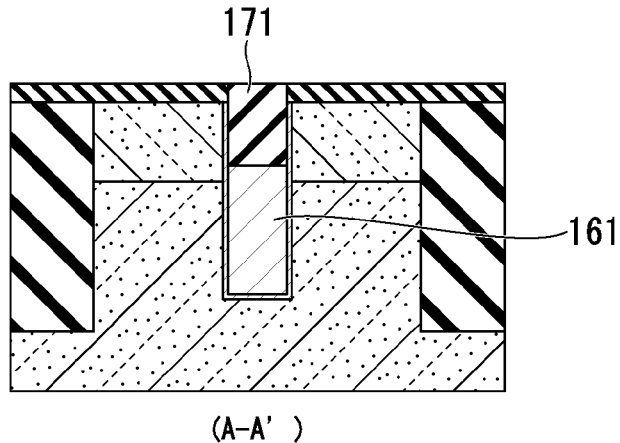
FIG. 8A is a fragmentary cross sectional elevation view, taken along an A-A' line of FIG. 8D, of a step, subsequent to the step of FIGS. 7A to 7C involved in the method of forming the semiconductor device in accordance with one or more preferred embodiment of the present invention.
Figure 8B:
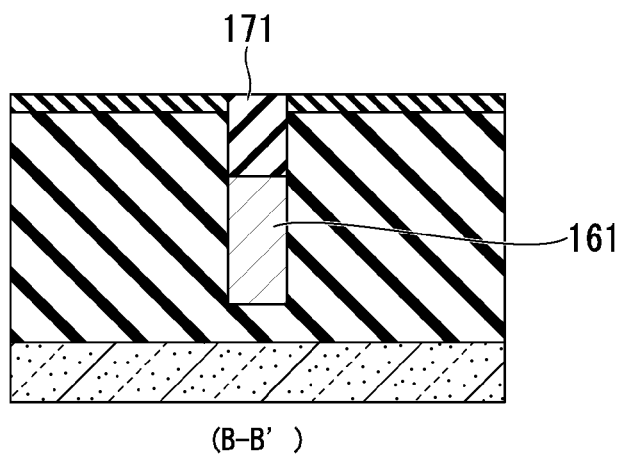
FIG. 8B is a fragmentary cross sectional elevation view, taken along a B-B' line of FIG. 8D, of the same step as of FIG. 8A, subsequent to the step of FIGS. 7A to 7C involved in the method of forming the semiconductor device in accordance with one or more preferred embodiment of the present invention.
Figure 8C:
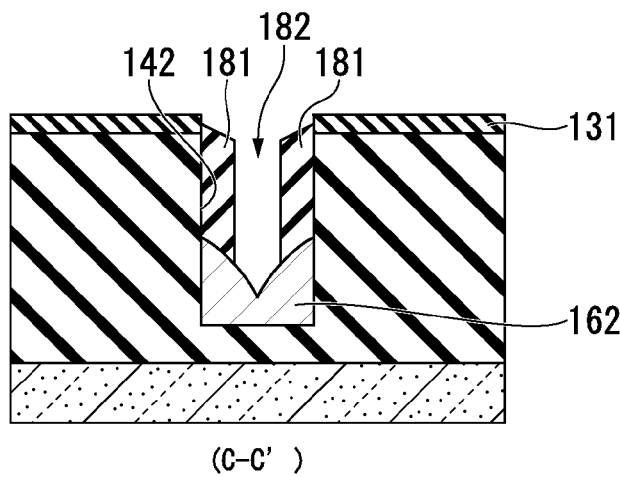
FIG. 8C is a fragmentary cross sectional elevation view, taken along a C-C' line of FIG. 8D, of the same step as of FIG. 8A, subsequent to the step of FIGS. 7A to 7C involved in the method of forming the semiconductor device in accordance with one or more preferred embodiment of the present invention.
Figure 8D:
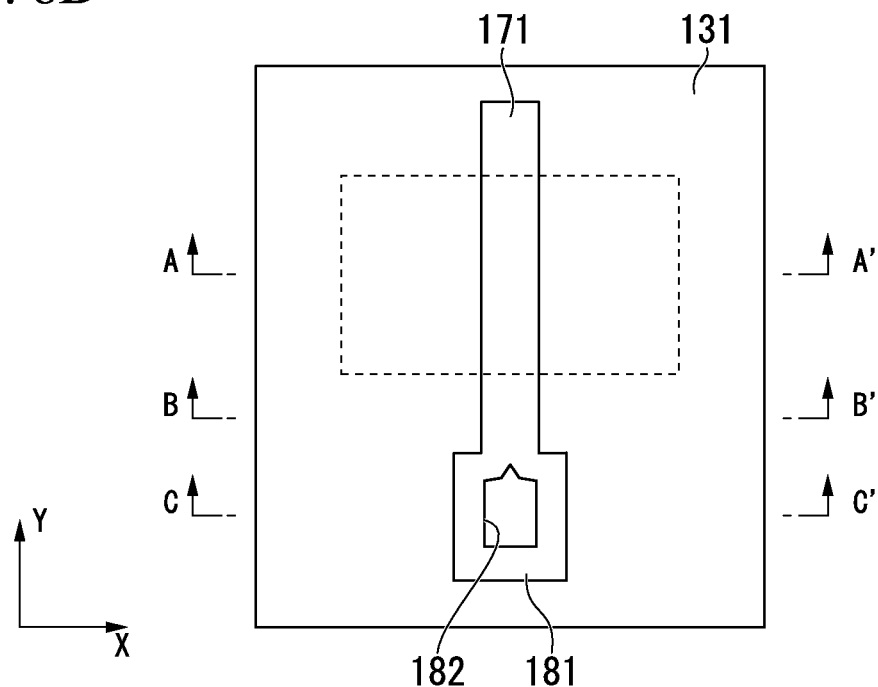
FIG. 8D is a fragmentary plan view of the step of FIGS. 8A to 8C in accordance with one or more preferred embodiment of the present invention.

The capping insulating film 171 is etched-back so that the capping insulating film 171 is buried within the recess unit 163 on the gate electrode 161 and simultaneously the capping insulating film 171 remains on an inner circumferential surface of the pad trench 142 to form an insulating film sidewall 181 on the pad electrode 162. An upper surface of the pad electrode 162 on which the insulating film sidewall 181 is not covered is exposed. As shown in FIG. 8D, a pad contact hole 182 is formed in a central portion of the pad electrode 162.

When the pad contact hole 182 is formed, since the pad contact hole 182 is formed by etching-back the capping insulating film 171 having a small thickness, the pad electrode 162 is exposed to an atmosphere of the etching gas and thus, the pad electrode 162 is not entirely removed even when an overetching process is sufficiently applied. That is, it is easy to control an etch-back process to prevent the pad contact hole 182 from penetrating the pad electrode 162.

Since the pad contact hole 182 is formed to be self-aligned using a side of the pad trench 142, the pad contact hole 182 is provided in the central portion of the pad electrode 162 without an alignment error.

When the pad contact hole 182 is formed, since an additional process of fabricating a mask using photolithography technology is not necessary, it is advantageous for keeping fabrication cost down.

Figure 9:
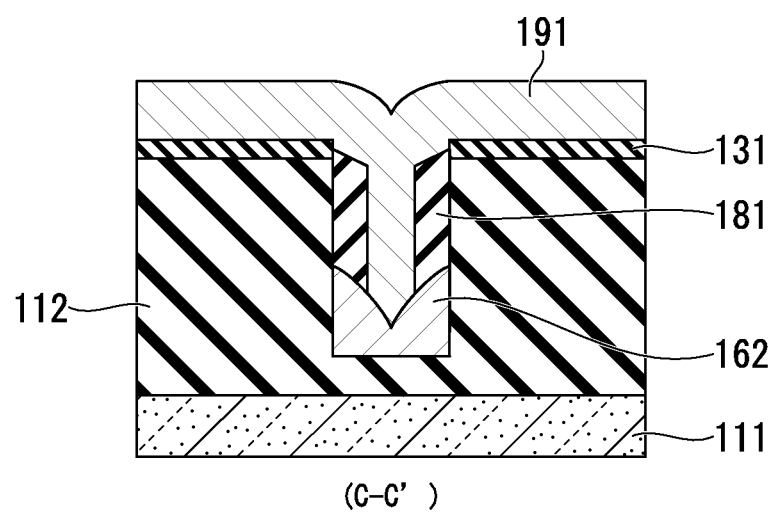
FIG. 9 is a fragmentary cross sectional elevation view, taken along a C-C' line of FIG. 8D, subsequent to the step of FIGS. 8A to 8D involved in the method of forming the semiconductor device in accordance with one or more preferred embodiment of the present invention.

As shown in FIG. 9, a pad contact plug material 191 is formed to be buried within the pad contact hole 182. As the pad contact plug material 191, a W film may be taken as an example. A TiN film may be provided under the W film as a bather film. The plug may be formed using a conductive film such as a refractory metal film other than W or a doped silicon film.

Figure 10A:
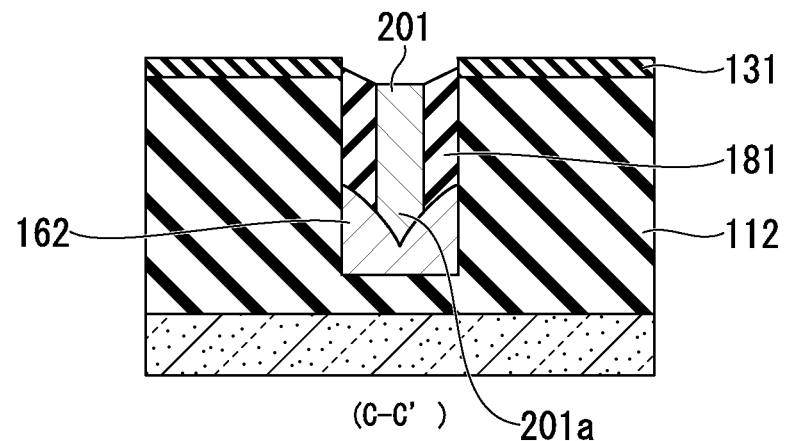
FIG. 10A is a fragmentary cross sectional elevation view, taken along a C-C' line of FIG. 10D, subsequent to the step of FIG. 9 involved in the method of forming the semiconductor device in accordance with one or more preferred embodiment of the present invention.
Figure 10B:
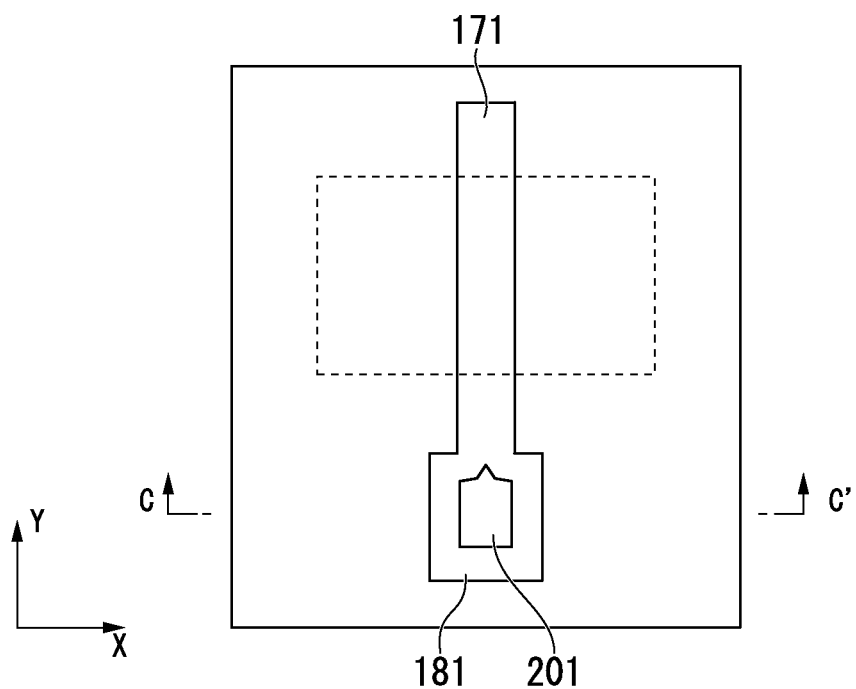
FIG. 10B is a fragmentary plan view of the step of FIG. 10A in accordance with one or more preferred embodiment of the present invention.

As shown in FIGS. 10A and 10B, the pad contact plug material 191 is etched-back to be buried within the pad contact hole 182, thereby forming a pad contact plug 201. Other than the etch-back process, a chemical mechanical polishing (CMP) method may be used. In an example of the pad contact plug 201, since the concave unit 162a is formed in the central portion of the pad electrode 162 under the pad contact plug 201, a downward convex unit 201a is formed in a bottom portion of the pad contact plug 201.

Figure 11A:
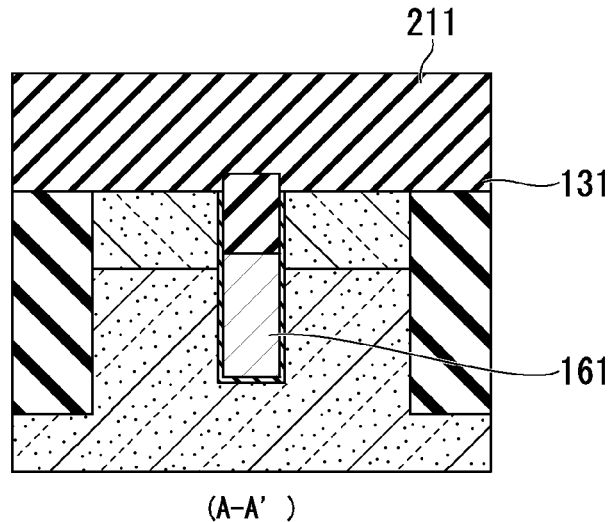
FIG. 11A is a fragmentary cross sectional elevation view, taken along an A-A' line of FIG. 8D, of a step, subsequent to the step of FIGS. 10A to 10B involved in the method of forming the semiconductor device in accordance with one or more preferred embodiment of the present invention.
Figure 11B:
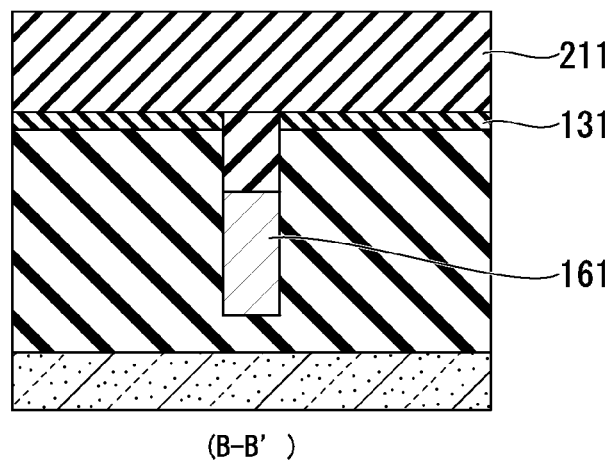
FIG. 11B is a fragmentary cross sectional elevation view, taken along a B-B' line of FIG. 8D, of the same step as of FIG. 11A, subsequent to the step of FIGS. 10A to 10B involved in the method of forming the semiconductor device in accordance with one or more preferred embodiment of the present invention.
Figure 11C:
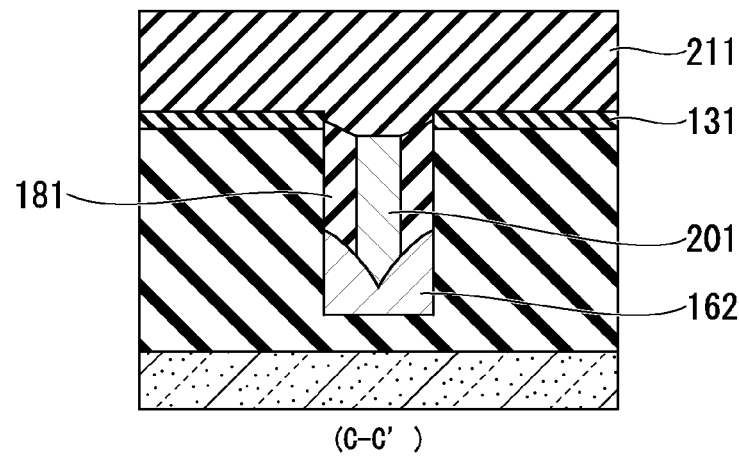
FIG. 11C is a fragmentary cross sectional elevation view, taken along a C-C' line of FIG. 8D, of the same step as of FIG. 11A, subsequent to the step of FIGS. 10A to 10B involved in the method of forming the semiconductor device in accordance with one or more preferred embodiment of the present invention.

As shown in FIGS. 11A to 11C, an interlayer film 211 is formed on the semiconductor substrate 111. When the interlayer film 211 is formed of a silicon oxide film, the interlayer film 211 is formed to a thickness of 100 nm.

Figure 12A:
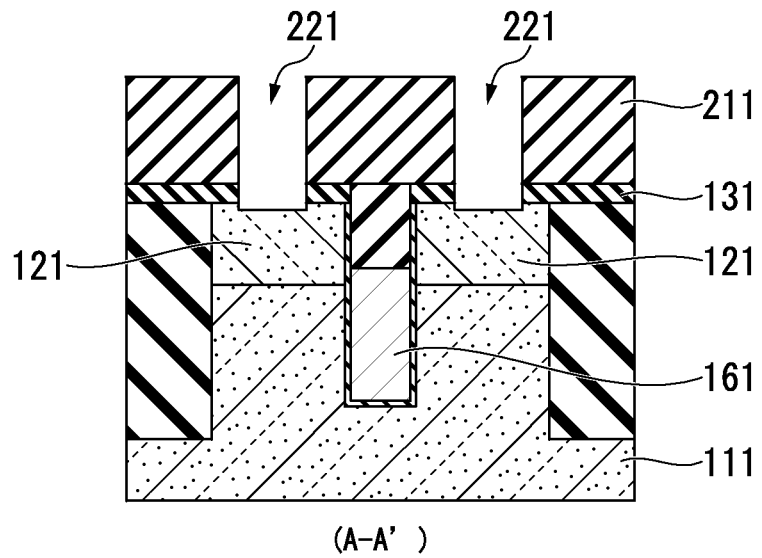
FIG. 12A is a fragmentary cross sectional elevation view, taken along an A-A' line of FIG. 12C, of a step, subsequent to the step of FIGS. 11A to 11C involved in the method of forming the semiconductor device in accordance with one or more preferred embodiment of the present invention.
Figure 12B:
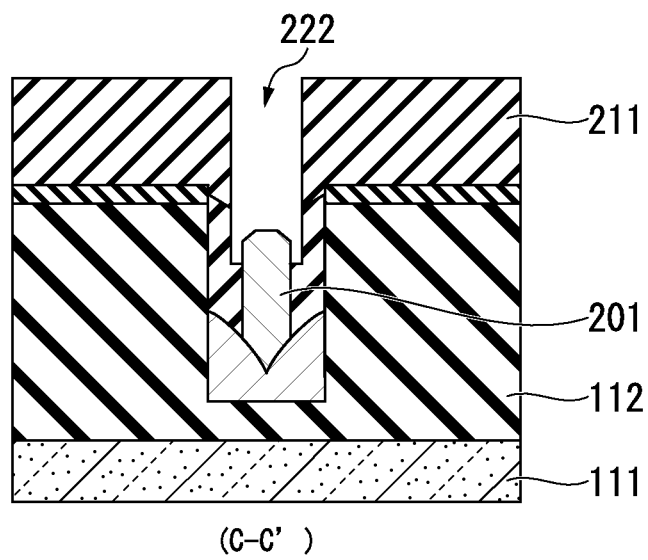
FIG. 12B is a fragmentary cross sectional elevation view, taken along a C-C' line of FIG. 12C, of the same step as of FIG. 12A, subsequent to the step of FIGS. 11A to 11C involved in the method of forming the semiconductor device in accordance with one or more preferred embodiment of the present invention.
Figure 12C:
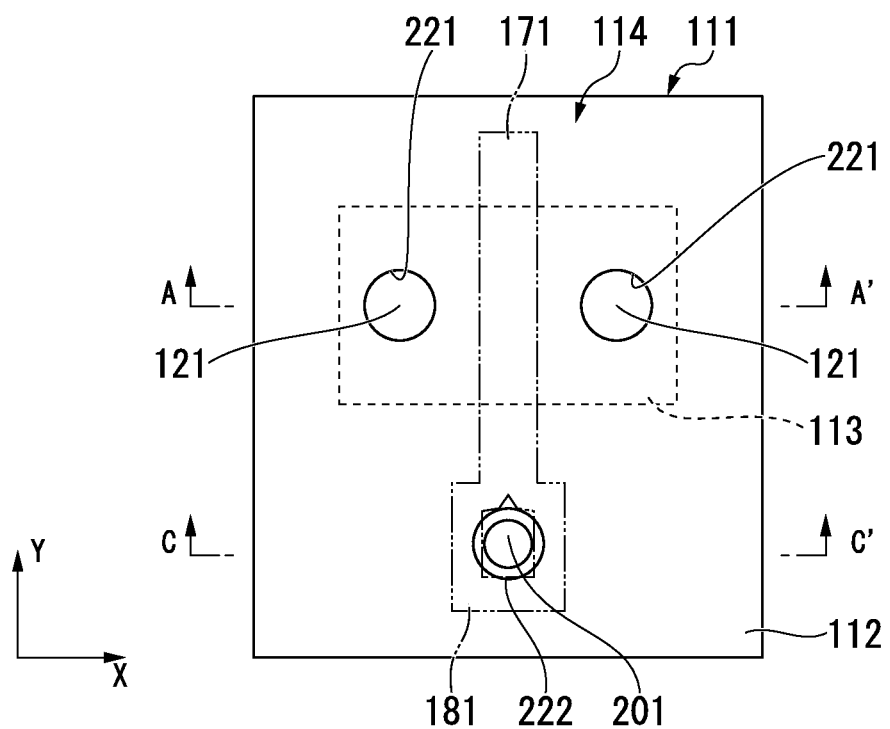
FIG. 12C is a fragmentary plan view of the step of FIGS. 12A to 12B in accordance with one or more preferred embodiment of the present invention.

As shown in FIGS. 12A-12C, a diffusion layer contact hole 221 which penetrates the interlayer film 211 and the protection film 131 and exposes an upper surface of the diffusion layer 121, and a gate contact hole 222 which penetrates the interlayer film 211 and exposes an upper portion of the pad contact plug 201, are formed.

An interlayer contact plug material is formed to fill the diffusion layer contact hole 221 and the gate contact hole 222. As the interlayer contact plug material, a W film may be taken as an example. A TiN film, and the like may be provided under the W film as a bather film. Further, the plug may be formed using a conductive film such as a refractory metal film other than W or a doped silicon film.

Figure 13A:
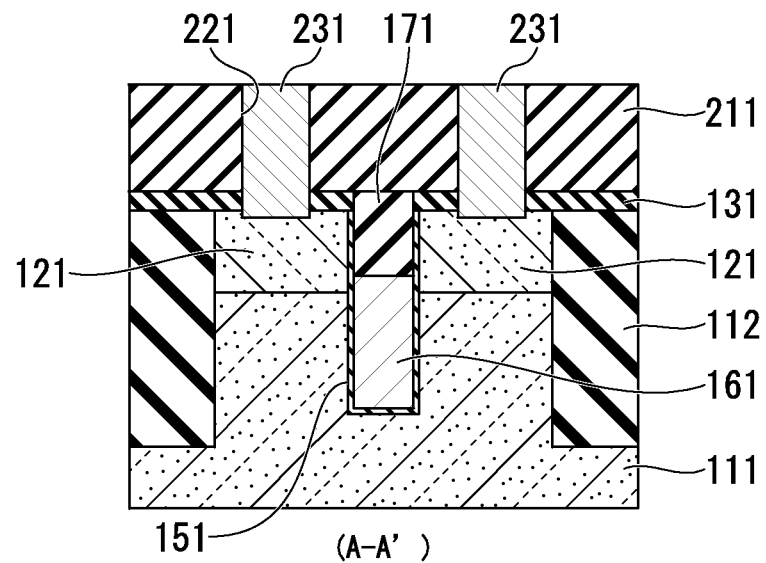
FIG. 13A is a fragmentary cross sectional elevation view, taken along an A-A' line of FIG. 12C, of a step, subsequent to the step of FIGS. 12A to 12C involved in the method of forming the semiconductor device in accordance with one or more preferred embodiment of the present invention.
Figure 13B:
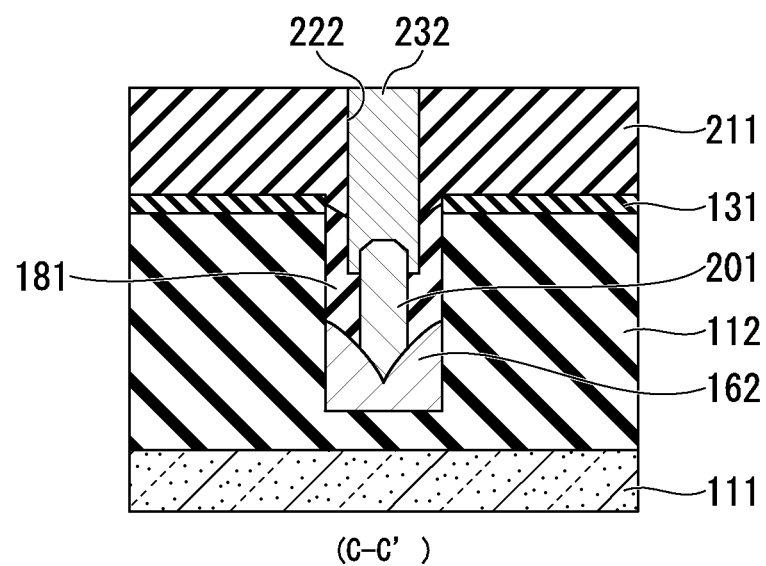
FIG. 13B is a fragmentary cross sectional elevation view, taken along a C-C' line of FIG. 12C, of the same step as of FIG. 13A, subsequent to the step of FIGS. 12A to 12C involved in the method of forming the semiconductor device in accordance with one or more preferred embodiment of the present invention.

As shown in FIGS. 13A and 13B, the interlayer contact plug material is polished and removed using a CMP method to form a diffusion layer contact plug 231 within the diffusion layer contact hole 221, and a gate contact plug 232 within the gate contact hole 222.

The pad electrode 162 is drawn to an upper surface of the interlayer film 211 through the pad contact plug 201 and the gate contact plug 232.

Figure 14A:
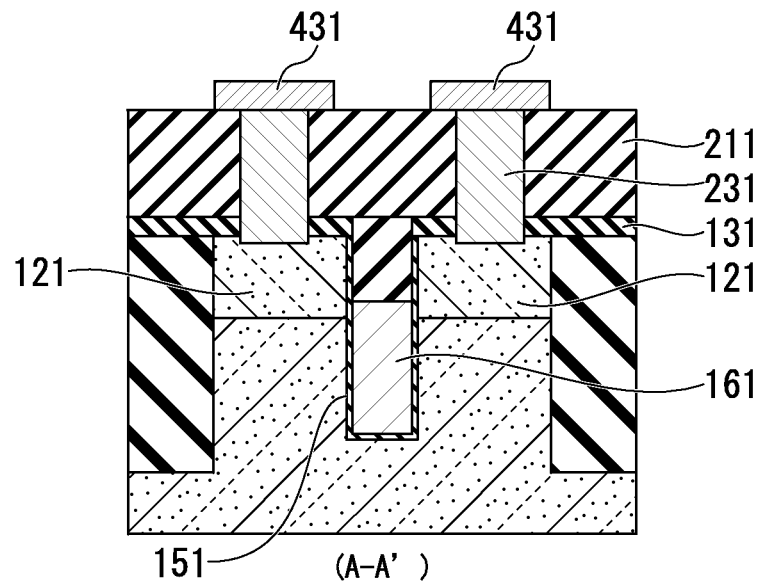
FIG. 14A is a fragmentary cross sectional elevation view, taken along an A-A' line of FIG. 14C, of a step, subsequent to the step of FIGS. 13A to 13B involved in the method of forming the semiconductor device in accordance with one or more preferred embodiment of the present invention.
Figure 14B:
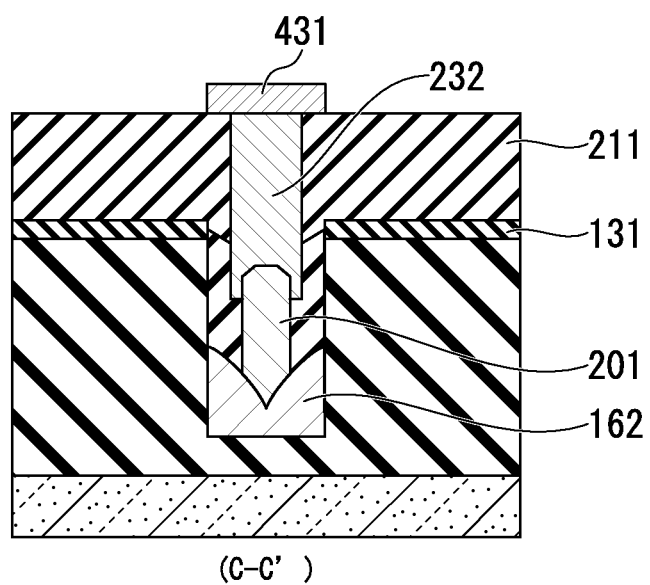
FIG. 14B is a fragmentary cross sectional elevation view, taken along a C-C' line of FIG. 14C, of the same step as of FIG. 14A, subsequent to the step of FIGS. 13A to 13B involved in the method of forming the semiconductor device in accordance with one or more preferred embodiment of the present invention.
Figure 14C:
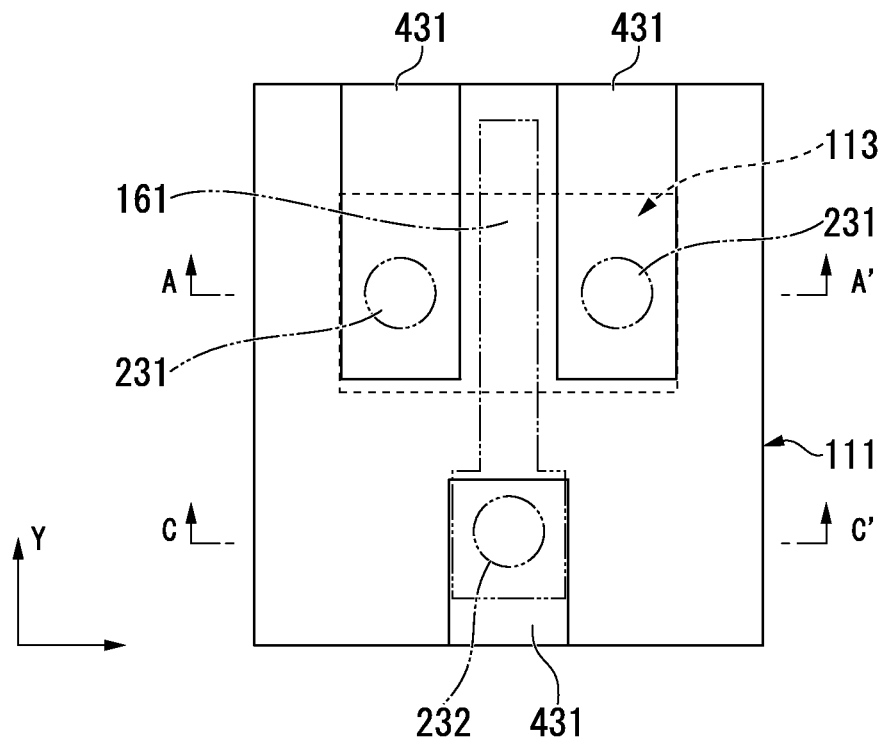
FIG. 14C is a fragmentary plan view of the step of FIGS. 14A to 14B in accordance with one or more preferred embodiment of the present invention.

As shown in FIGS. 14A to 14C, a metal interconnection 431, which is connected to an upper surface of the diffusion layer contact plug 231 or an upper surface of the gate contact plug 232, is formed of aluminum (Al), copper (Cu), W, or the like.

Through the above processes, interconnections which are connected to the gate electrode 161 formed in the trench, and the diffusion layers 121 serving as the source and drain electrodes, may be formed.

In addition, in this embodiment, although the interlayer film 211 is formed after the pad contact plug 201 is formed in the process illustrated in FIGS. 10A and 10B, a local interconnection layer for drawing the gate electrode, which is directly connected to the pad contact plug 201, may be formed in advance after the process illustrated in FIGS. 10A and 10B without forming the interlayer film 211.

Hereafter, if necessary, an upper interlayer film, an interconnection layer, a surface passivation layer, and the like may be further formed to complete a semiconductor device.

With respect to the method of fabricating a semiconductor device of the embodiment described above, the pad contact plug 201 is not formed in the state illustrated in FIG. 11C in a fabrication method of the related art. Thus, it is necessary to form a deep contact hole so that the gate contact hole 222 directly reaches the pad electrode 162 buried in a lower portion of the pad trench.

In an etching process of forming the deep contact hole, it is necessary to perform an over etching process for a sufficient time to prevent a missing failure of a contact by considering a difference in a thickness of the interlayer film 211 formed on the semiconductor substrate (a difference in a substrate surface). According to increase in a thickness of an insulating film in which a contact hole is formed, it is necessary to set an over-etching time longer. In the fabrication method of the related art, with increase of the etching time for the gate contact hole 222 which is formed to directly reach the pad electrode 162, the pad electrode 162 is also etched and thus penetration of the gate contact hole 222 occurs. When the penetration of the gate contact hole 222 occurs, since the element isolation film 112 thereunder is also etched, the gate contact plug 232 and the semiconductor substrate 111 are short-circuited.

In contrast, in this invention, since the pad contact plug 201 is formed in advance, the penetration when the gate contact plug 222 is formed can be prevented. When the pad contact plug 201 is formed, as described in the process of FIGS. 8A to 8D, since the protection film 131 to be etched is thin, an excessive over-etching process is not necessarily performed and the penetration can be easily prevented.

The above-described fabrication method may be modified without departing from the spirit and scope of the present invention.

For example, the diffusion layer 121 serving as the source and drain electrodes may be formed by applying an ion implantation process after the pad contact plug 201 is formed as illustrated in FIGS. 10A and 10B, rather than in the process of FIG. 2. Further, an ion implantation process of forming a lightly doped drain (LDD) region (low concentration impurity diffusion region), and the like in the diffusion layer 121 may be additionally performed.

SECOND EMBODIMENT

A second embodiment will be described providing a MOS transistor disposed in a DRAM memory cell.

Figure 15A:
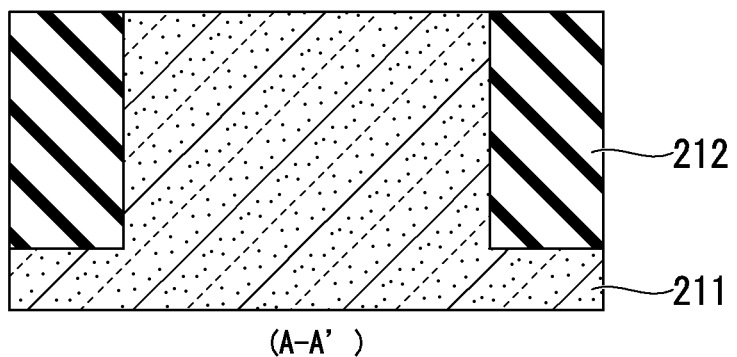
FIG. 15A is a fragmentary cross sectional elevation view, taken along an A-A' line of FIG. 15C, of a step involved in a method of forming a semiconductor device in accordance with one or more preferred embodiment of the present invention.
Figure 15B:
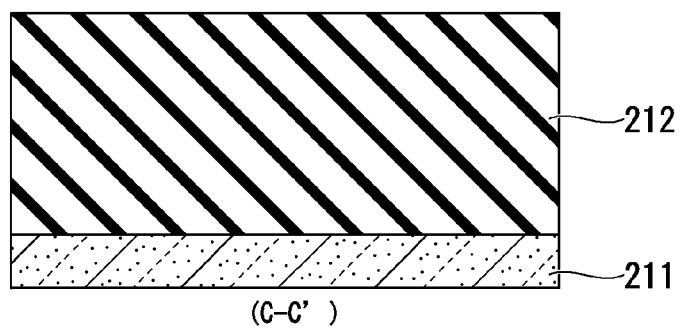
FIG. 15B is a fragmentary cross sectional elevation view, taken along an C-C' line of FIG. 15C, of the same step as of FIG. 15A involved in the method of forming the semiconductor device in accordance with one or more preferred embodiment of the present invention.
Figure 24A:
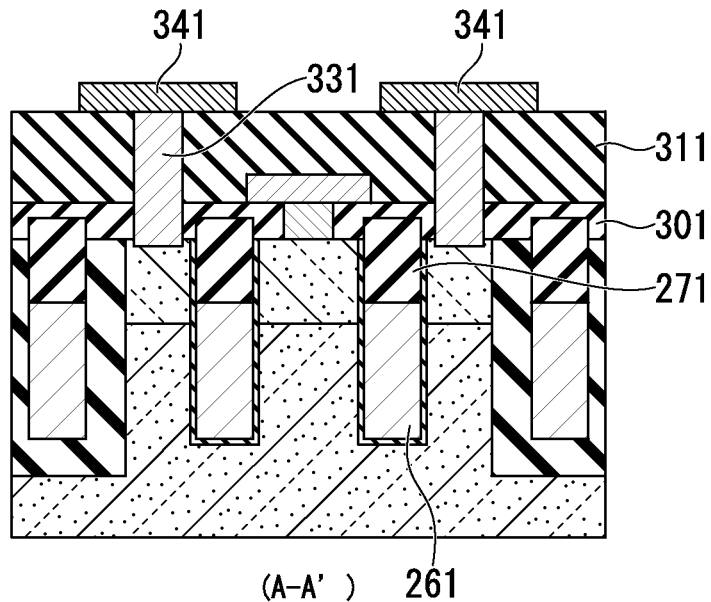
FIG. 24A is a fragmentary cross sectional elevation view, taken along an A-A' line of FIG. 24C, of a step, subsequent to the step of FIGS. 23A to 23 B involved in the method of forming the semiconductor device in accordance with one or more preferred embodiment of the present invention.
Figure 24B:
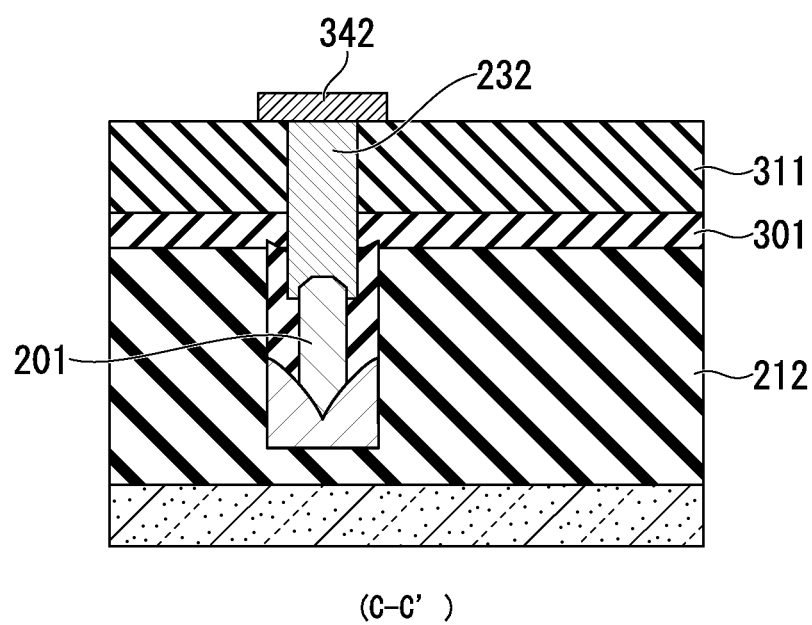
FIG. 24B is a fragmentary cross sectional elevation view, taken along a C-C' line of FIG. 24C, of the same step as of FIG. 24A, subsequent to the step of FIGS. 23A to 23B involved in the method of forming the semiconductor device in accordance with one or more preferred embodiment of the present invention.
Figure 24C:
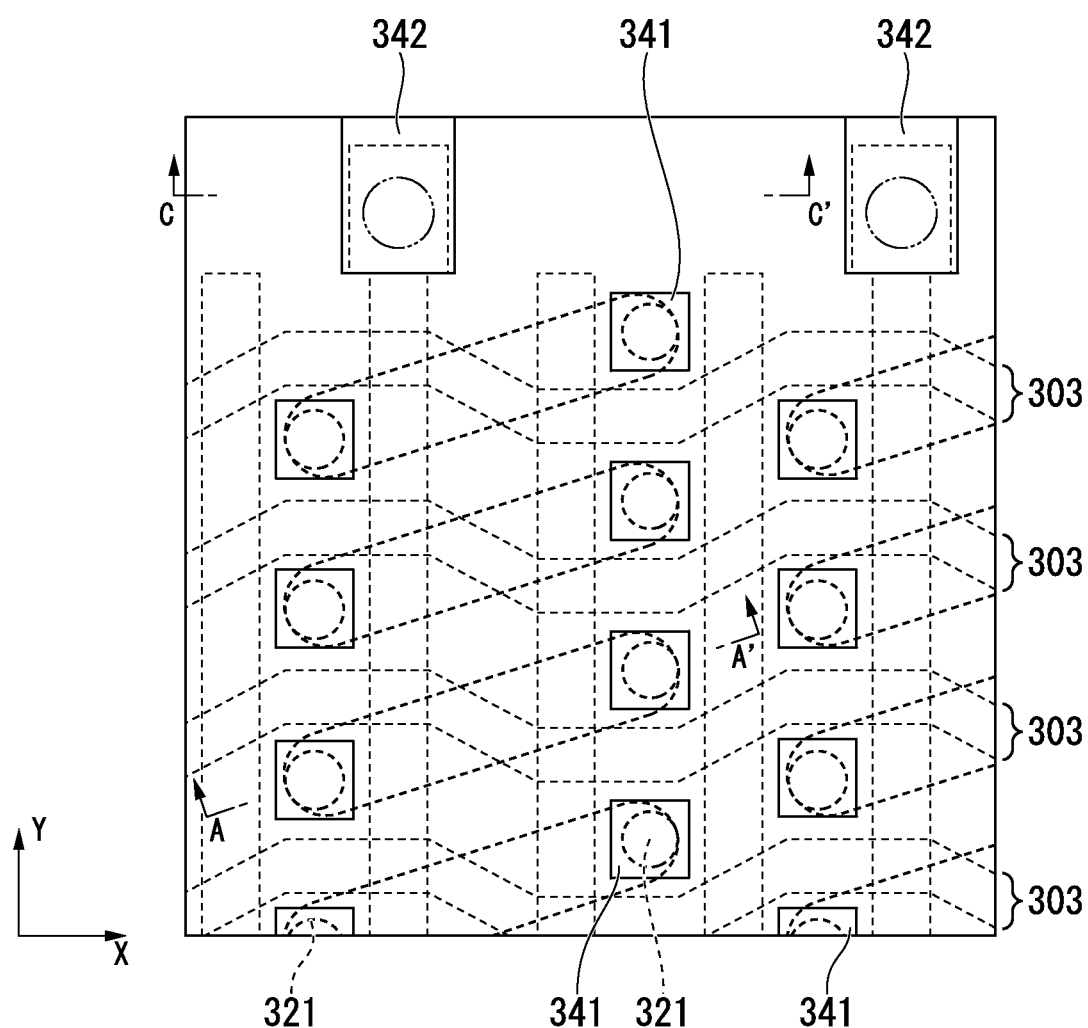
FIG. 24C is a fragmentary plan view of the step of FIGS. 24A to 24B in accordance with one or more preferred embodiment of the present invention.
Figure 25A:
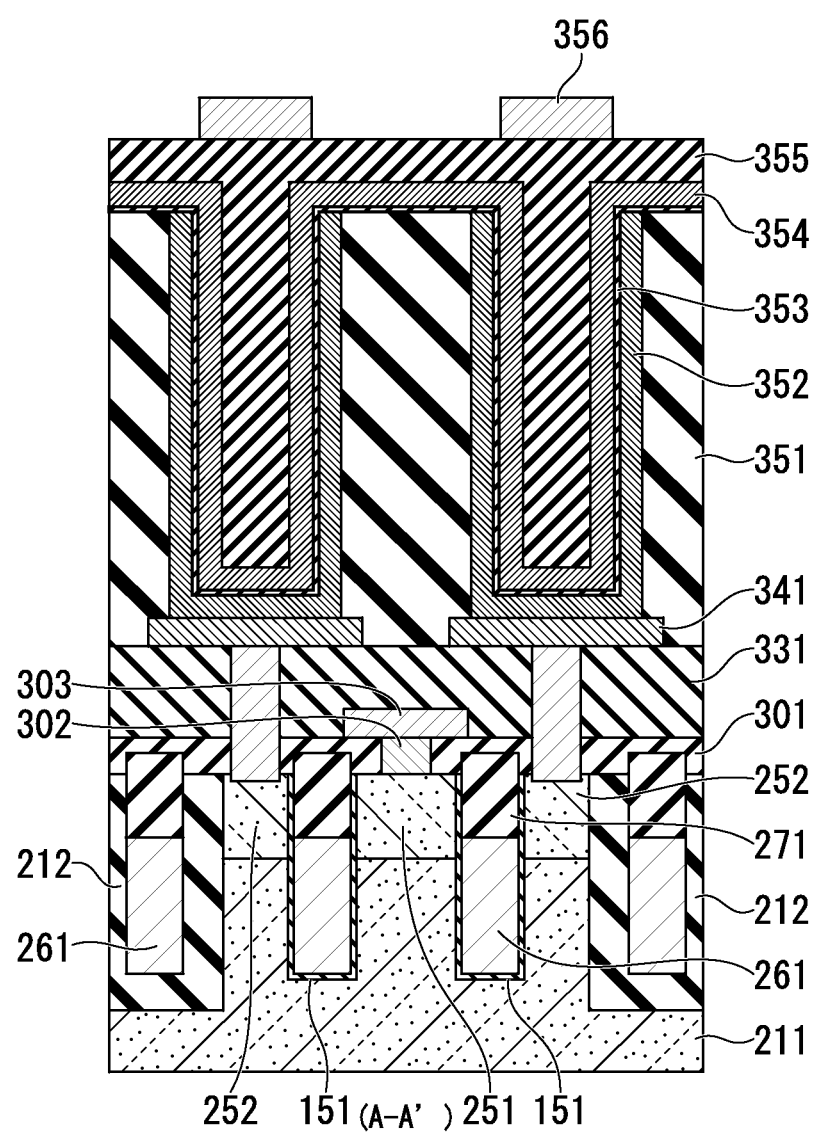
FIG. 25A is a fragmentary cross sectional elevation view, taken along an A-A' line of FIG. 24C, of a step, subsequent to the step of FIGS. 24A to 24C involved in the method of forming the semiconductor device in accordance with one or more preferred embodiment of the present invention.
Figure 25B:
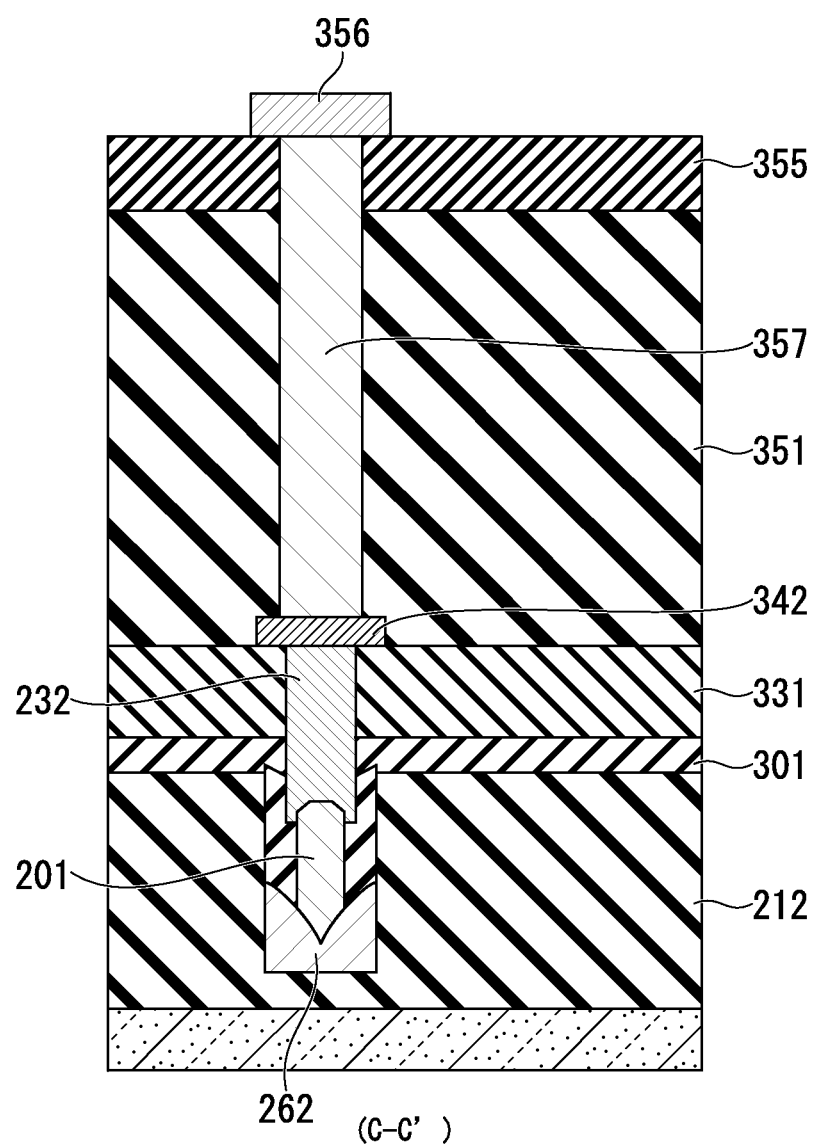
FIG. 25B is a fragmentary cross sectional elevation view, taken along a C-C' line of FIG. 24C, of the same step as of FIG. 25A, subsequent to the step of FIGS. 24A to 24C involved in the method of forming the semiconductor device in accordance with one or more preferred embodiment of the present invention.

In this embodiment, a case where a memory cell of a DRAM including a MOS transistor having a structure illustrated in FIGS. 25A and 25B is fabricated by performing a method to be described below based on FIGS. 15A to 25B with respect to a semiconductor substrate 211 illustrated in FIGS. 15A and 15B will be described.

Figure 15C:
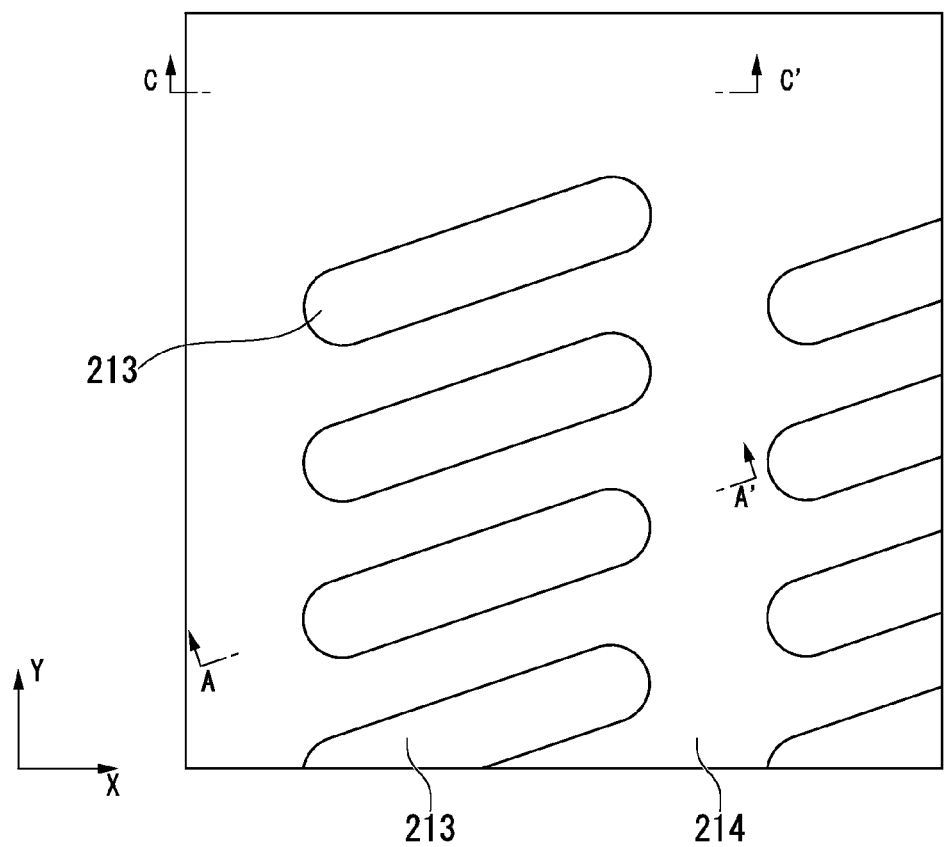
FIG. 15C is a fragmentary plan view of the step of FIGS. 15A and 15B in accordance with one or more preferred embodiment of the present invention.

For clarity, as shown in FIGS. 15C and 16D, an X direction and a Y direction are defined in a plane parallel to the semiconductor substrate 211 and are orthogonal to each other.

As in the case of the first embodiment previously described, an element isolation region 214 including an element isolation film 212 is formed on the semiconductor substrate 211. An active region 213 partitioned by the element isolation region 214 is formed. In this embodiment, a P type silicon substrate is used as the semiconductor substrate 211. The active region 213 in which memory cells are to be formed has an elongated pattern extending in a first direction crossing the X direction at a predetermined angle, and a plurality of the patterns are formed parallel to the first direction as well as parallel to the Y direction.

The line C-C' shown in FIG. 15C is in an edge portion of a memory cell region and corresponds to a cross-section at a position in which a pad for applying a potential to a word line (gate electrode) is arranged.

As in the foregoing first embodiment, a diffusion layer is formed in a portion of a surface of the semiconductor substrate 211 corresponding to the active region 213 arranged as shown in FIG. 15C, and like the first embodiment, a protection film 131 is formed. Like the first embodiment, a resist mask 232 having a resist opening 235 is formed. As shown in FIG. 16C, the resist opening 235 according to this embodiment includes a gate opening 233 extending in the Y direction and a pad opening 234 connected to an end portion of the gate opening 233, when viewed in plan.

The gate openings 233 are arranged parallel to the X direction and two gate openings 233 are disposed to cross each active region 213. One gate opening 233 is formed between adjacent active regions 213. In FIG. 16C, since first, third, and fourth pad openings 234 from the left are disposed at an edge portion of a memory cell region opposite FIG. 16C along the Y direction, the first, third, and fourth pad openings 234 are not drawn in FIG. 16C. The pad opening 234 is also disposed between the active regions 213 so that since continuity in patterning is improved, pattern accuracy when miniaturized is improved.

Figure 16A:
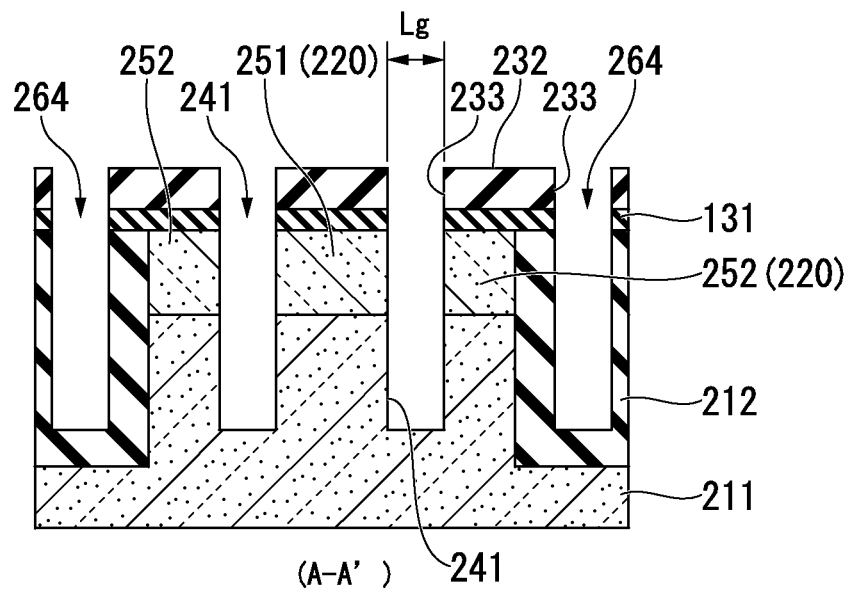
FIG. 16A is a fragmentary cross sectional elevation view, taken along an A-A' line of FIG. 16C, of a step, subsequent to the step of FIGS. 15A to 15C involved in the method of forming the semiconductor device in accordance with one or more preferred embodiment of the present invention.
Figure 16:
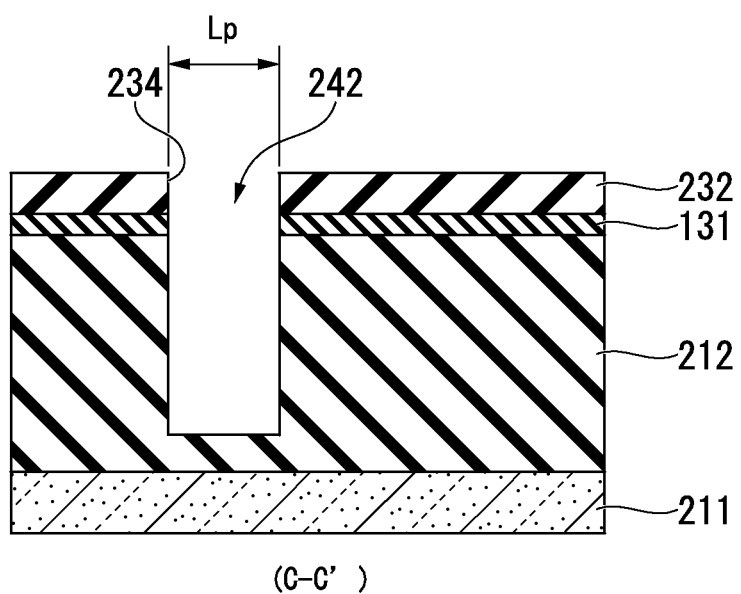
FIG. 16B is a fragmentary cross sectional elevation view, taken along a C-C' line of FIG. 16C, of the same step as of FIG. 16A, subsequent to the step of FIGS. 15A to 15C involved in the method of forming the semiconductor device in accordance with one or more preferred embodiment of the present invention.
FIG. 16C is a fragmentary plan view of the step of FIGS. 16A to 16B in accordance with one or more preferred embodiment of the present invention.
Figure 16C:
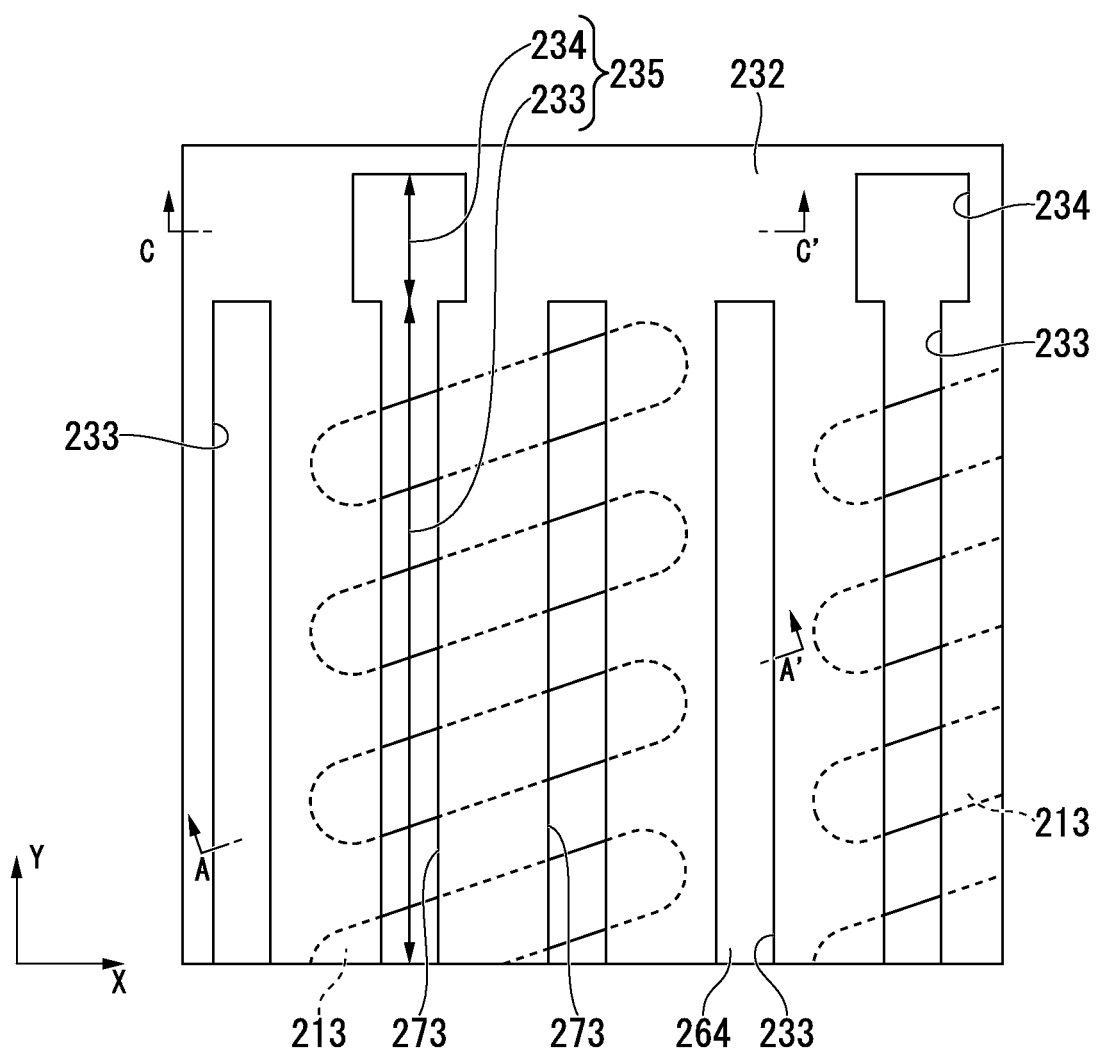
Figure 17A:
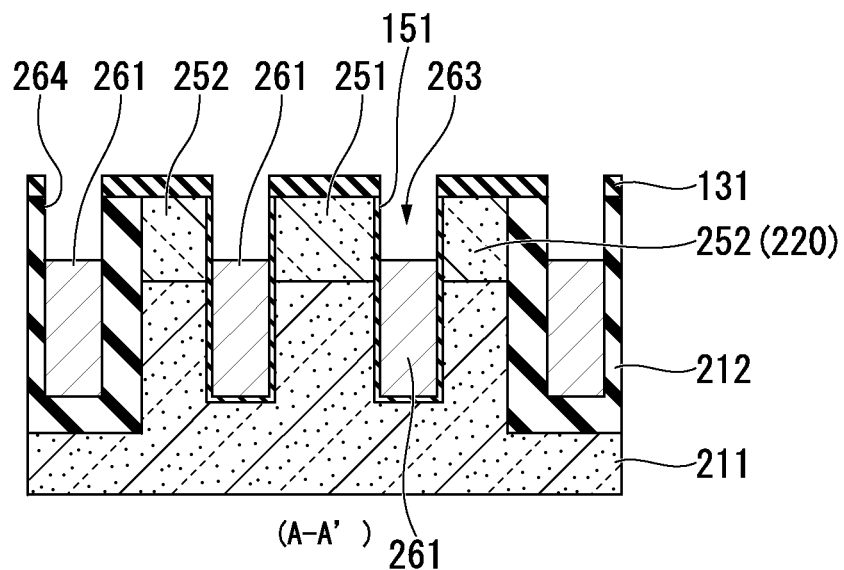
FIG. 17A is a fragmentary cross sectional elevation view, taken along an A-A' line of FIG. 16C, of a step, subsequent to the step of FIGS. 16A to 16C involved in the method of forming the semiconductor device in accordance with one or more preferred embodiment of the present invention.
Figure 17B:
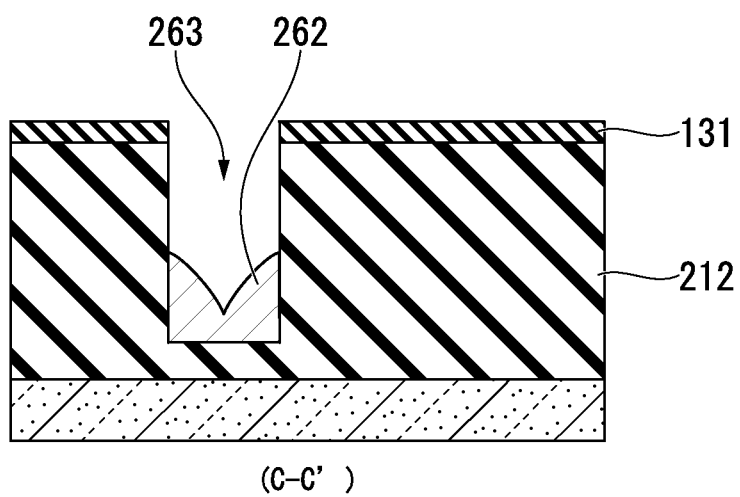
FIG. 17B is a fragmentary cross sectional elevation view, taken along a C-C' line of FIG. 16C, of the same step as of FIG. 17A, subsequent to the step of FIGS. 16A to 16C involved in the method of forming the semiconductor device in accordance with one or more preferred embodiment of the present invention.

As shown in FIGS. 16A and 16B, an opening width of the gate opening 233 in the X direction is defined as Lg and an opening width of the pad opening 234 in the Y direction is defined as Lp. Lg is formed to be larger than Lg. In this embodiment, Lg is 50 nm and Lp is 120 nm as in the foregoing first embodiment.

Figure 4B:
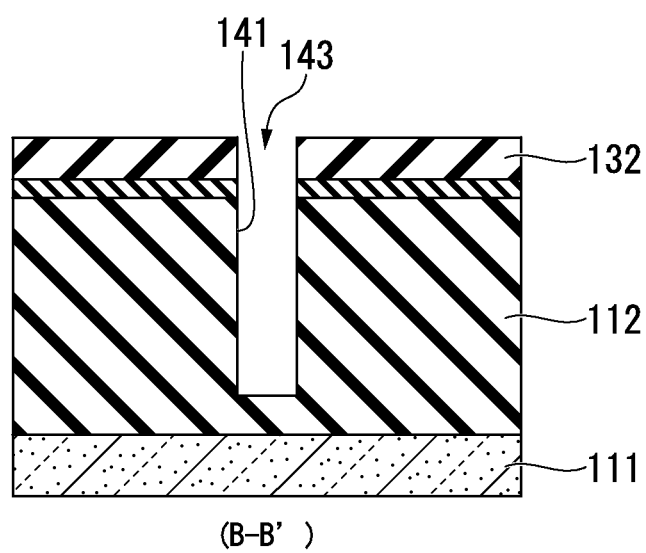
FIG. 4B is a fragmentary cross sectional elevation view, taken along a B-B' line of FIG. 3D, of the same step as of FIG. 4A, subsequent to the step of FIGS. 3A to 3D involved in the method of forming the semiconductor device in accordance with one or more preferred embodiment of the present invention.
Figure 4C:
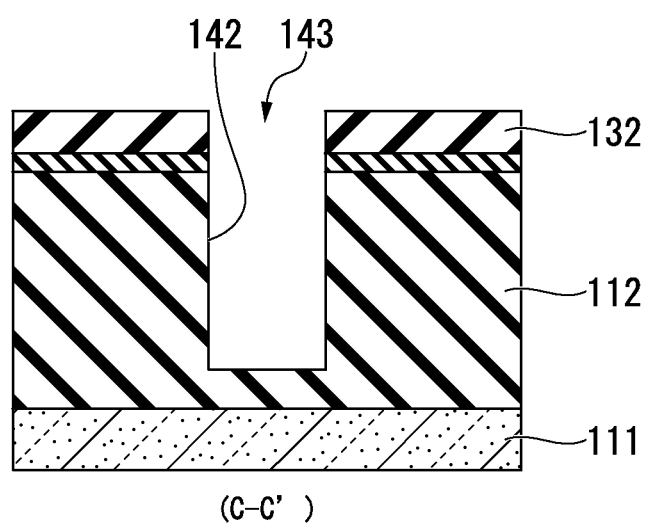
FIG. 4C is a fragmentary cross sectional elevation view, taken along a C-C' line of FIG. 3D, of the same step as of FIG. 4A, subsequent to the step of FIGS. 3A to 3D involved in the method of forming the semiconductor device in accordance with one or more preferred embodiment of the present invention.

As in the process according to the first embodiment shown in FIGS. 4A to 4C, the protection film 131 is etched using the resist mask 232 to expose the surface of the semiconductor substrate 211 corresponding to the active region 213 and the element isolation film 212 of the element isolation region 214. Subsequently, the exposed semiconductor substrate 211 and the exposed element isolation film 212 are etched to form a trench. Therefore, the trench is formed in a portion opened by the resist opening.

As in the process according to the foregoing first embodiment shown in FIGS. 4A to 4C, in this embodiment, the trench is formed so that a depth thereof from the surface of the semiconductor substrate is about 150 nm.

Gate electrodes of transistors are buried within two trenches traversing each active region 213 in the Y direction in a subsequent process. The two trenches are denoted as gate trenches 241.

At the same time, a gate electrode is also buried within a trench formed between adjacent active regions 213 in the X direction. However, since it does not serve as a MOS transistor, the trench is referred to as a dummy trench 264.

A trench formed in the pad opening 234 is referred to as a pad trench 242. A diffusion layer 220 formed in the surface of the semiconductor substrate 211 of the active region 213 is divided into three regions in the X direction by two gate trenches 273. For clarity, a central region is referred to as a source diffusion layer 251 and left and right regions are referred to as drain diffusion layers 252. Two transistors are formed in the left and right sides using the source diffusion layer 251 as a common region.

The resist mask 132 is removed. As in the process according to the first embodiment described based on FIGS. 5A to 5C, a gate insulating film 151 is formed on the semiconductor substrate 211 exposed by the trench. Subsequently, a gate electrode film is formed within each trench and then etched-back. As in the process according to the first embodiment described based on FIGS. 6A to 6C, gate electrodes 261 buried inside the gate trench 241 and the dummy trench 264, and a pad electrode 262 remaining in a lower portion of the pad trench 242, are formed. The gate electrode 261 within the gate trench 241 extends in the Y direction and serves as a word line. The pad electrode 262 is positioned at an edge portion of the word line and used to provide a predetermined potential to the word line.

It is preferable to apply a fixed potential (for example, a ground potential 0V) to the gate electrode within the dummy trench 264 through the pad electrode of an edge portion thereof from the view point of stabilization of an operation of the DRAM. Like the foregoing first embodiment, a recess unit 263 is formed on the gate electrodes 261 and the pad electrode 262. The pad electrode 262 is formed to remain at a position deeper than the gate electrodes 261 from the surface of the semiconductor substrate 211.

Figure 18A:
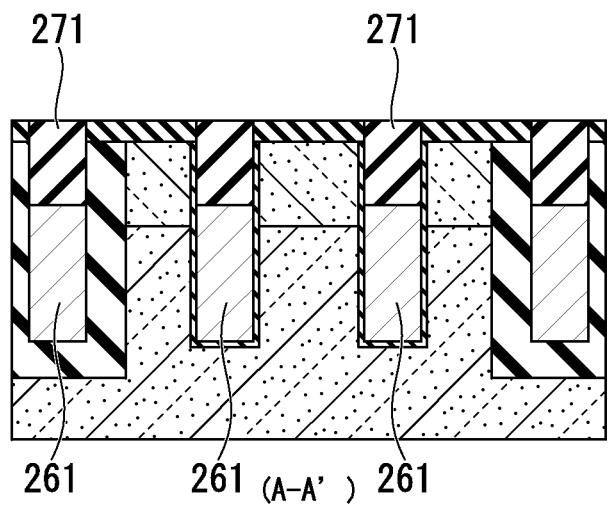
FIG. 18A is a fragmentary cross sectional elevation view, taken along an A-A' line of FIG. 16C, of a step, subsequent to the step of FIGS. 17A to 17B involved in the method of forming the semiconductor device in accordance with one or more preferred embodiment of the present invention.
Figure 18B:
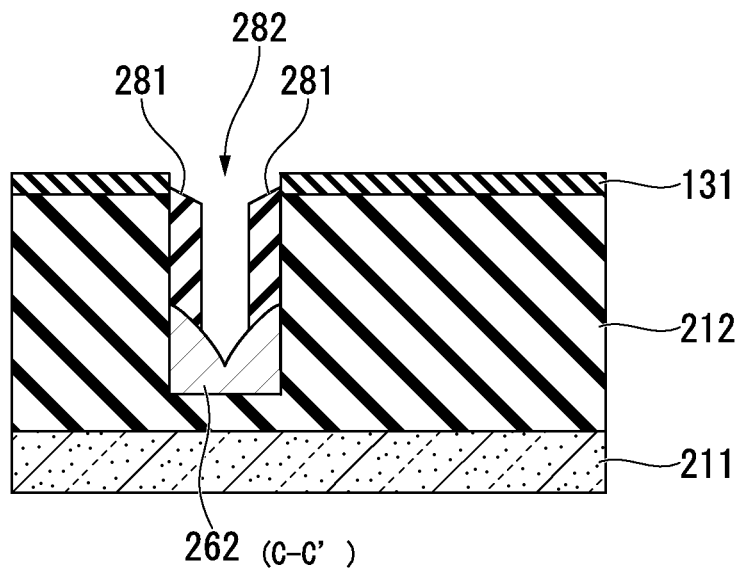
FIG. 18B is a fragmentary cross sectional elevation view, taken along a C-C' line of FIG. 16C, of the same step as of FIG. 18A, subsequent to the step of FIGS. 17A to 17B involved in the method of forming the semiconductor device in accordance with one or more preferred embodiment of the present invention.

As in the process according the first embodiment described based on FIGS. 7A to 7C, a capping insulating film 271 is formed to fill the recess unit 263 on the gate electrodes 261 and not to fill the recess unit 263 on the pad electrode 262 by controlling a thickness thereof, as shown in FIGS. 18A to 18C. In this embodiment, the capping insulating film 271 may be formed of a silicon oxide film using a CVD method.

As in the process according to the first embodiment described based on FIGS. 8A to 8D, the capping insulating film 271 is etched-back so that, as shown in FIG. 18A, the capping insulating film 271 is buried in the recess unit 263 on the gate electrodes 261 and simultaneously, as shown in FIG. 18B, an insulating film sidewall 281 is formed in an inner circumferential surface of the trench on the pad electrode 262. Therefore, a pad contact hole 282 exposing a central portion of the pad electrode 262 is formed.

Figure 19A:
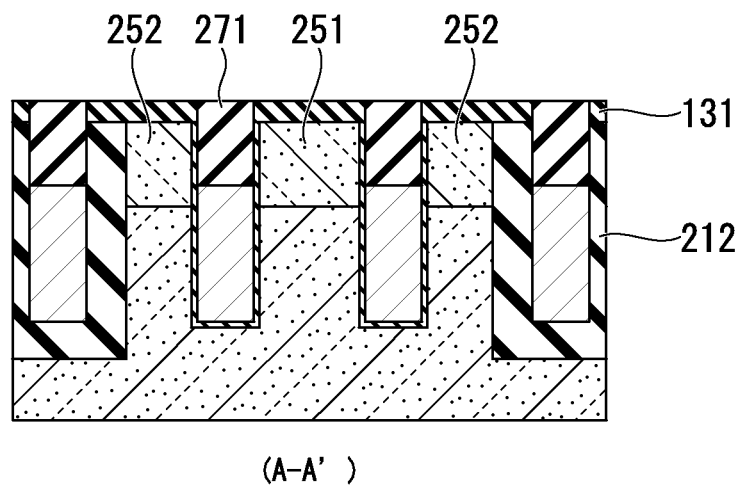
FIG. 19A is a fragmentary cross sectional elevation view, taken along an A-A' line of FIG. 19C, of a step, subsequent to the step of FIGS. 18A to 18B involved in the method of forming the semiconductor device in accordance with one or more preferred embodiment of the present invention.
Figure 19B:
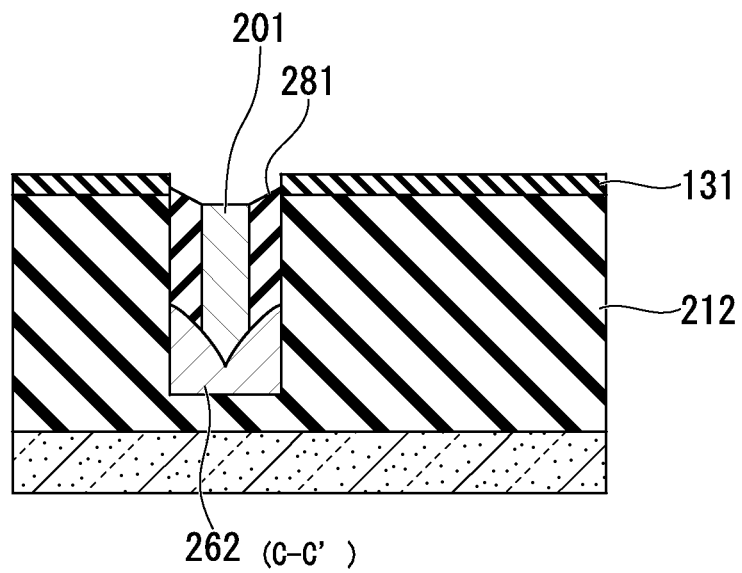
FIG. 19B is a fragmentary cross sectional elevation view, taken along a C-C' line of FIG. 19C, of the same step as of FIG. 19A, subsequent to the step of FIGS. 18A to 18B involved in the method of forming the semiconductor device in accordance with one or more preferred embodiment of the present invention.
Figure 19C:
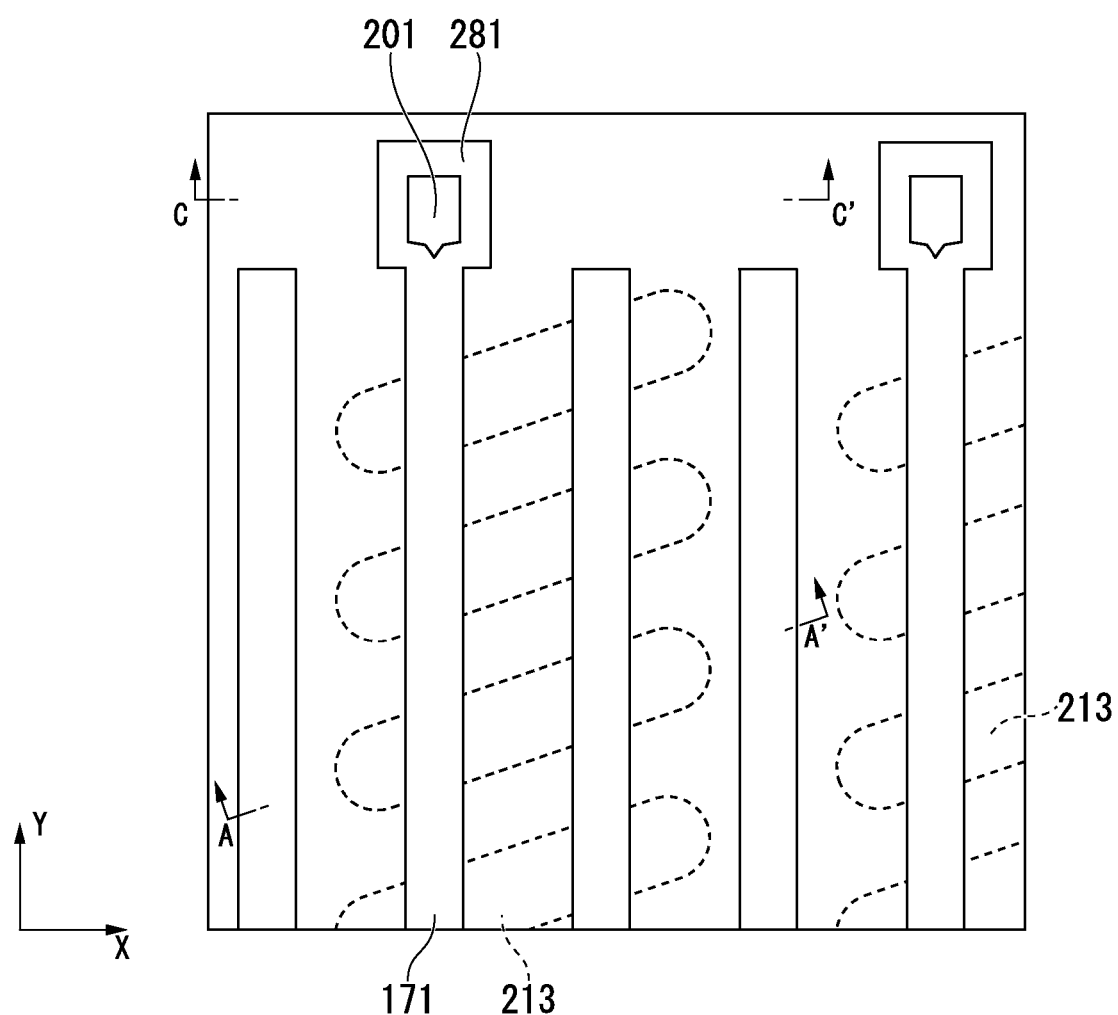
FIG. 19C is a fragmentary plan view of the step of FIGS. 19A to 19B in accordance with one or more preferred embodiment of the present invention.

A pad contact plug material is formed to be buried within the pad contact hole 282 and then etched-back, thereby forming a pad contact plug 201 as shown in FIG. 19B. A CMP process other than an etch-back process may be performed. As a material of the contact plug, a W film may be taken as an example.

Figure 20A:
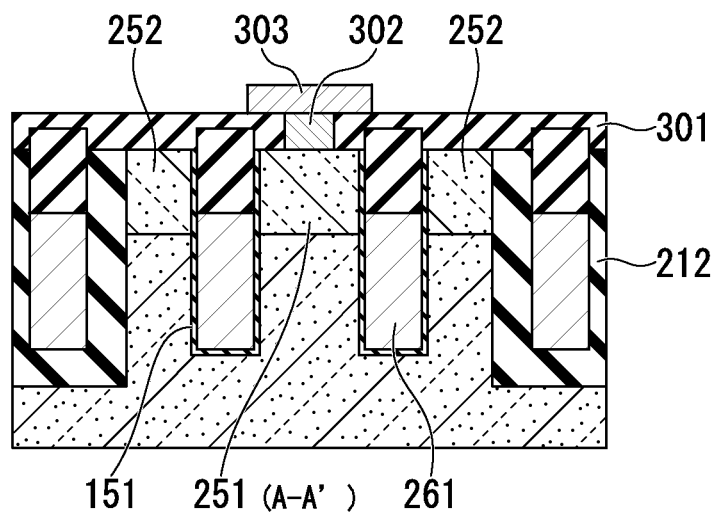
FIG. 20A is a fragmentary cross sectional elevation view, taken along an A-A' line of FIG. 19C, of a step, subsequent to the step of FIGS. 19A to 19C involved in the method of forming the semiconductor device in accordance with one or more preferred embodiment of the present invention.
Figure 20B:
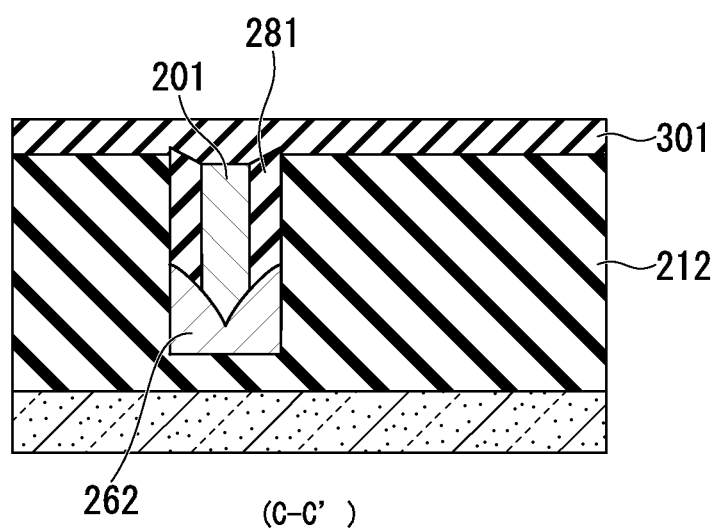
FIG. 20B is a fragmentary cross sectional elevation view, taken along a C-C' line of FIG. 19C, of the same step as of FIG. 20A, subsequent to the step of FIG. 19A to 19C involved in the method of forming the semiconductor device in accordance with one or more preferred embodiment of the present invention.
Figure 21A:
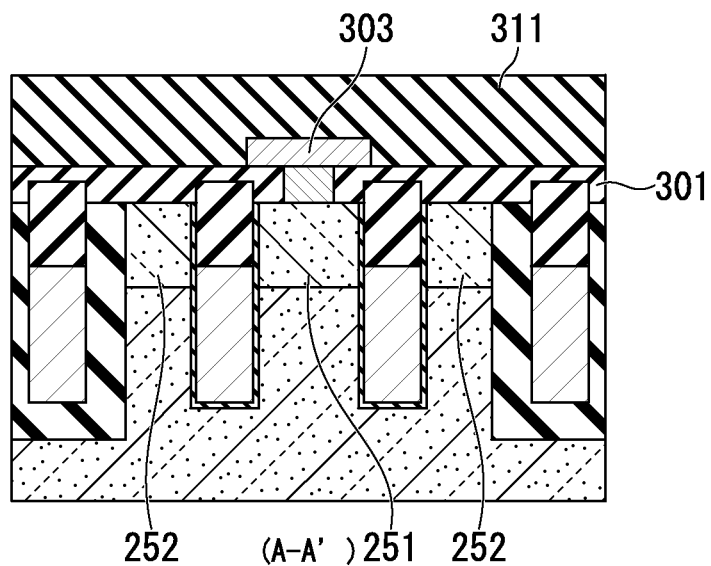
FIG. 21A is a fragmentary cross sectional elevation view, taken along an A-A' line of FIG. 19C, of a step, subsequent to the step of FIGS. 20A to 20C involved in the method of forming the semiconductor device in accordance with one or more preferred embodiment of the present invention.
Figure 21B:
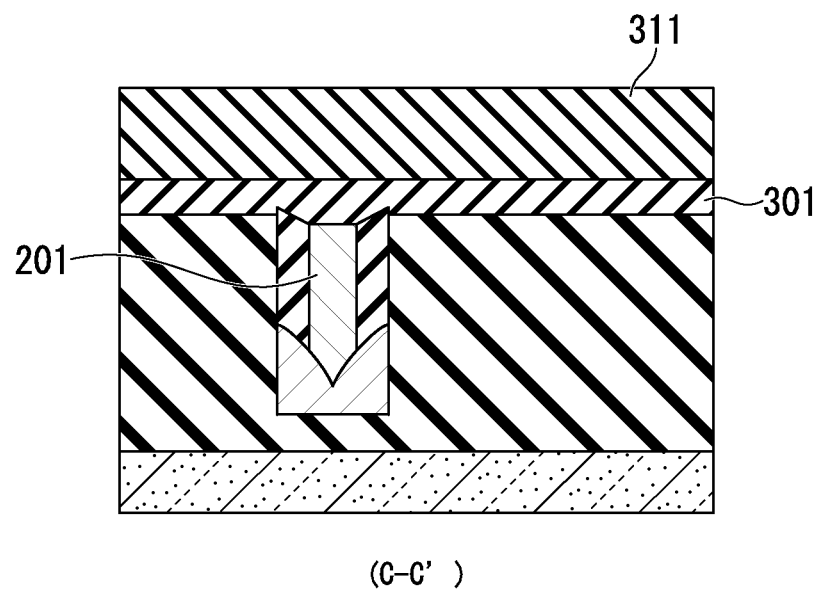
FIG. 21B is a fragmentary cross sectional elevation view, taken along a C-C' line of FIG. 19C, of the same step as of FIG. 21A, subsequent to the step of FIGS. 20A to 20C involved in the method of forming the semiconductor device in accordance with one or more preferred embodiment of the present invention.

As shown in FIGS. 20A to 20B, a first interlayer film 301 is formed on the semiconductor substrate. The first interlayer film 301 may be formed of a silicon oxide film to a thickness of about 30 nm. For clarity, an interface line between the protection film 131 and the first interlayer film 301 is omitted, and thus the protection film 131 is included in the first interlayer film 301 and described as the first interlayer film.

A source contact hole exposing the source diffusion layer 251 is formed and a conductive film is buried in the source contact hole to form a source contact plug 302.

An interconnection connected to the source contact plug 302 is formed and is referred to as a bit line 303. The bit line 303 may include W, or the like. As shown in FIG. 24C, a planar pattern of the bit line 303 meanders along the X direction.

A second interlayer film 311 is formed to cover the bit line 303. The second interlayer film 311 may be formed of a silicon oxide film to a thickness of 100 nm.

Figure 22A:
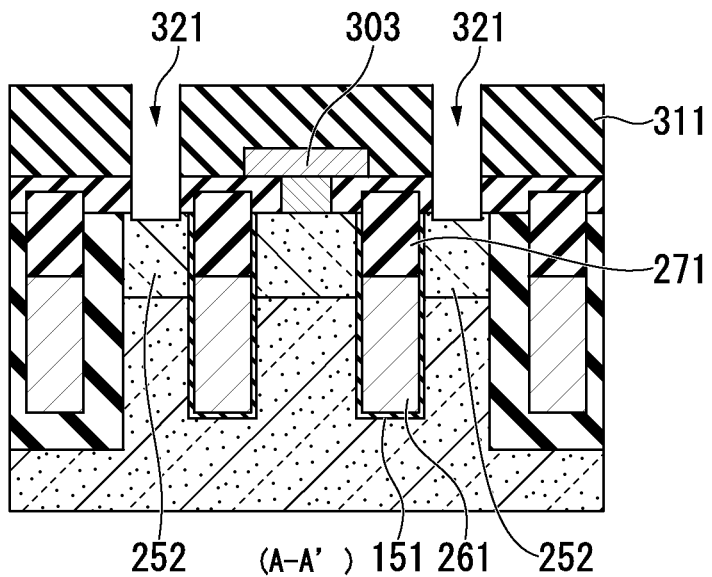
FIG. 22A is a fragmentary cross sectional elevation view, taken along an A-A' line of FIG. 19C, of a step, subsequent to the step of FIGS. 21A to 21C involved in the method of forming the semiconductor device in accordance with one or more preferred embodiment of the present invention.
Figure 22B:
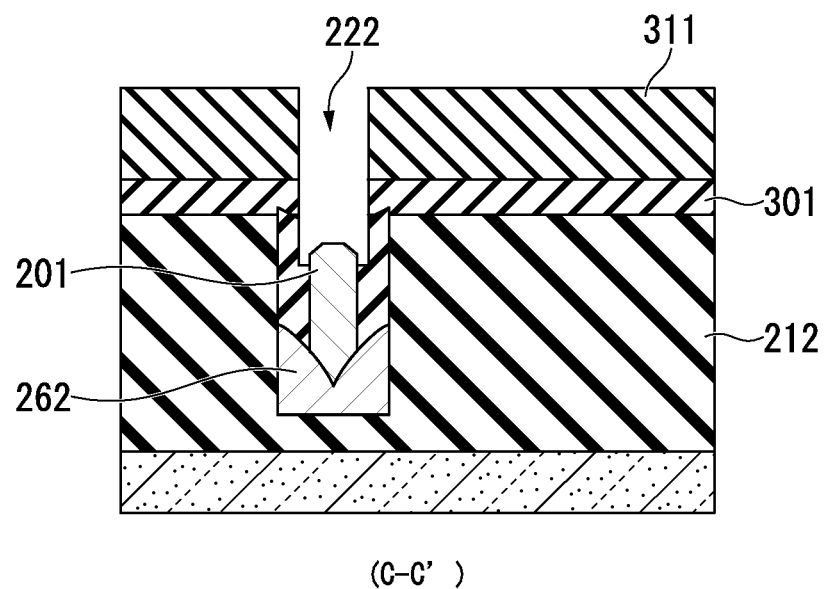
FIG. 22B is a fragmentary cross sectional elevation view, taken along a C-C' line of FIG. 19C, of the same step as of FIG. 22A, subsequent to the step of FIGS. 21A to 21C involved in the method of forming the semiconductor device in accordance with one or more preferred embodiment of the present invention.

As shown in FIG. 22A, a drain contact hole 321 penetrating the second interlayer film 311 and the first interlayer film 301 and opening an upper surface of the drain diffusion layer 252 is formed and, as shown in FIG. 22B, a gate contact hole 222 penetrating the second interlayer film 311 and the first interlayer film 301 and opening an upper portion of the pad contact plug 201 is formed. As shown in FIG. 24C, the drain contact hole 321 is formed between adjacent bit lines 303 in the Y direction so that the bit line 303 is not exposed.

Figure 23A:
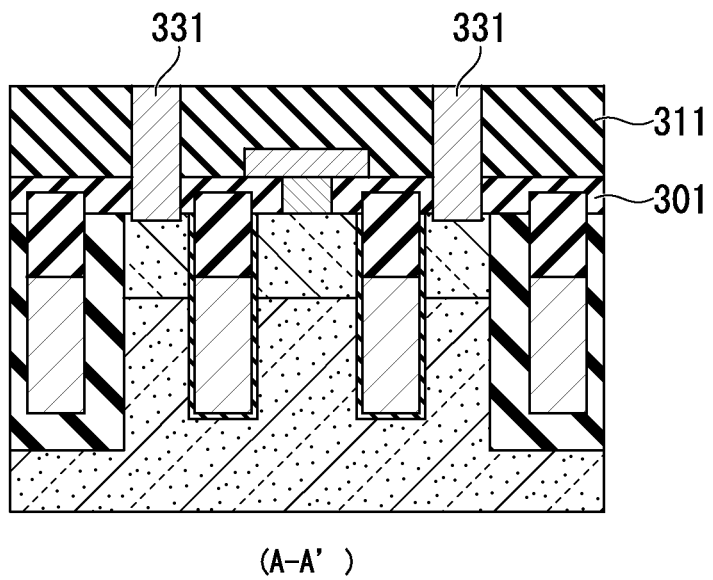
FIG. 23A is a fragmentary cross sectional elevation view, taken along an A-A' line of FIG. 19C, of a step, subsequent to the step of FIGS. 22A to 22 B involved in the method of forming the semiconductor device in accordance with one or more preferred embodiment of the present invention.
Figure 23B:
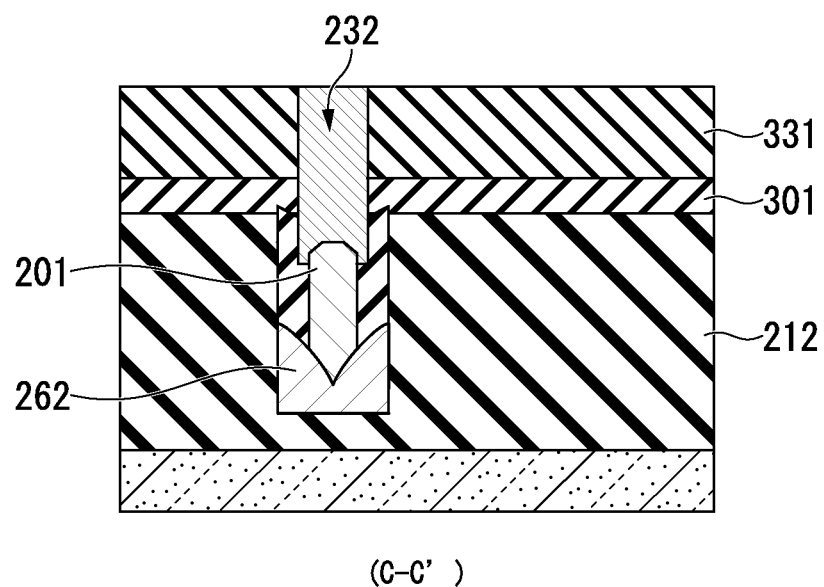
FIG. 23B is a fragmentary cross sectional elevation view, taken along a C-C' line of FIG. 19C, of the same step as of FIG. 23A, subsequent to the step of FIGS. 22A to 22 B involved in the method of forming the semiconductor device in accordance with one or more preferred embodiment of the present invention.

As shown in FIGS. 23A and 23B, a conductive film such as W is buried within the drain contact hole 321 and the gate contact hole 222 to form a drain contact plug 331 and a gate contact plug 232.

A local interconnection 342 is formed on the gate contact plug 232 and a capacitor pad 341 is formed on the drain contact plug 331. The local interconnection 342 and the capacitor pad 341 may be simultaneously patterned and formed in the interconnection material, for example, using a stack film in which tungsten is deposited on the tungsten nitride (WN).

A third interlayer film 351 is formed. The third interlayer film 351 may be formed of a silicon oxide film to a thickness of 2 nm. A capacitor hole penetrating the third interlayer film 351 and exposing an upper surface of the capacitor pad 341 is formed.

A capacitor lower electrode 352 is formed within each capacitor hole to cover an inner wall of the capacitor hole. As a formation material of the capacitor lower electrode 352, TiN may be taken as an example.

A capacitor insulating film 353 is formed of a high dielectric material such as zirconium oxide ($ZrO_2$). An electrode film for forming a capacitor upper electrode is formed and patterned to form a capacitor upper electrode 354. As a material for forming the upper electrode, TiN may be taken as an example.

A fourth interlayer film 355 is formed and a peripheral contact hole penetrating the fourth interlayer film 355 and the third interlayer film 351 and exposing an upper surface of the local interconnection 342 is formed.

As shown in FIG. 25B, a conductive film such as W is buried within the peripheral contact hole to form a peripheral contact plug 357. The peripheral contact plug 357 is not necessarily formed just on the gate contact plug 232 and may be disposed at a position deviating from the gate contact pad 232 using the local interconnection 342 when viewed in plan.

A metal interconnection 356 connected to an upper surface of the peripheral contact plug 357 is formed of a conductive material such as Al or Cu.

If necessary, an upper interlayer film, an interconnection layer, a surface protection film, and the like are formed to complete a DRAM memory cell.

Even in the second embodiment, the pad contact plug 201 is formed in advance on the pad electrode 262 so that it is possible to prevent penetration of the gate contact plug 232 formed on the pad electrode 262.

Using the present invention as the second embodiment, it is possible to prevent reduction of fabrication yield of the DRAM having a highly integrated memory cell region.

Further, this invention is applicable to a semiconductor device in which a MOS transistor includes a gate electrode of a buried structure other than a DRAM.

APPLICABLE EXAMPLE

An applicable example of the semiconductor device according to the foregoing embodiments will be described.

Figure 26:
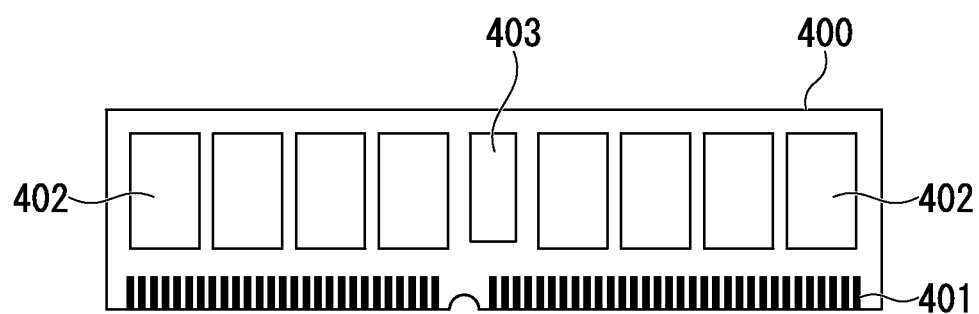
FIG. 26 is a side view of a package including semiconductor chips as DRAMs in accordance with one or more preferred embodiment of the present invention.

FIG. 26 is a schematic view of a memory module including a semiconductor chip which is fabricated by the method described in the second embodiment and operates as a DRAM.

A package 402 is given in which a semiconductor chip operating as a DRAM is integrated and which is mounted on a printed board 400. As a typical type of the package, for example, a BGA structure may be taken as an example and is formed using semiconductor chips individualized by a known method.

A plurality of input/output terminals (I/O terminals) 401 for electrically connecting the memory module to an external device are installed on the printed board 400. Input/output of data to/from each DRAM package 402 is performed through the input/output terminals 401.

A control chip 403 for controlling the input/output of the data to/from each DRAM package is included in the memory module. The control chip 403 has a function to perform timing adjustment, shaping of a signal waveform, and the like of a clock signal input from the outside of the memory module and provide the result to the DRAM package. Further, without disposing the control chip 403 on the printed board 400, only a plurality of DRAM packages may be mounted.

When the present invention is applied to fabrication of the DRAM to miniaturize the memory cell easily, it is possible to form a memory module with high data storage capacity.

For example, it is possible to form a data processing system to be described next using the above-described memory module including the DRAM chip formed using the present invention.

Figure 27:
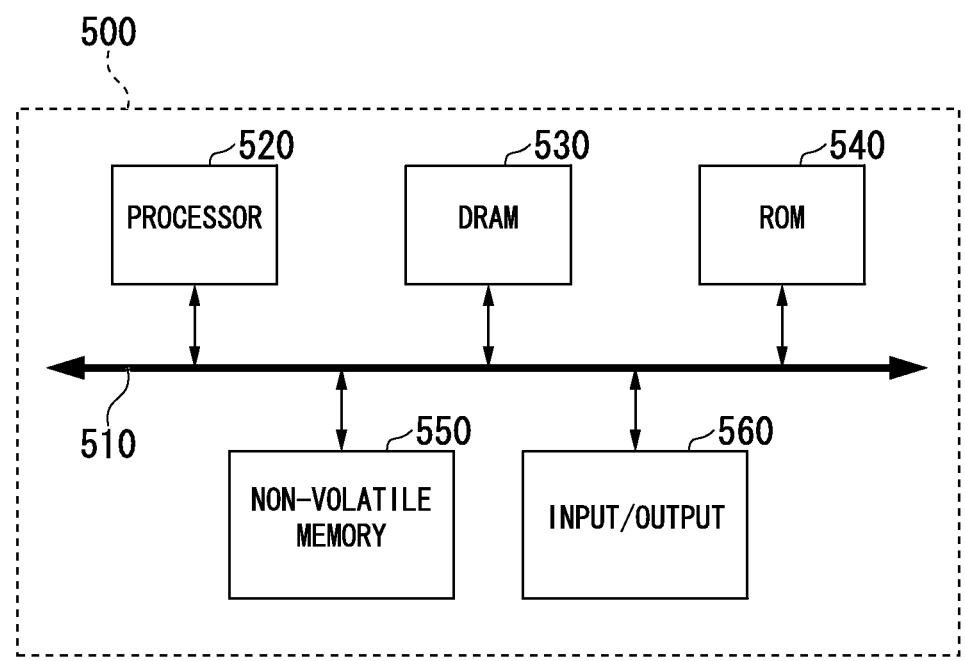
FIG. 27 is a diagram illustrating a data processing system in accordance with one or more preferred embodiment of the present invention.

FIG. 27 is a view showing a schematic configuration of a data processing system 500 according to this embodiment.

The data processing system 500 includes an arithmetic processing device 520 and a DRAM memory module 530 which are connected to each other through a system bus 510.

The arithmetic processing device 520 includes a microprocessing unit (MPU), a digital signal processor (DSP), or the like. The DRAM memory module 530 includes the DRAM chip formed using the present invention.

A read only memory (ROM) 540 for storage of fixed data may be connected to the system bus 510.

For clarity, although FIG. 27 illustrates one system bus 510, if necessary, system buses are connected in series or in parallel through a connector, or the like. Further, the devices may be interconnected by a local bus without the system bus 510. If necessary, in the data processing system 500, a nonvolatile memory device 550 and an I/O device 560 are connected to the system bus 510. The nonvolatile memory device 550 may include a hard disc, an optical drive, a solid state drive (SDD), or the like.

For example, the I/O device 560 includes a display device such as a liquid crystal display (LCD) or a data input device such as a keyboard.

While, for the sake of simplicity, the configuration of the data processing system 500 is illustrated in FIG. 27 as including only one of each component, there is no limitation here. The data processing system 500 may include a plurality of any or all of the components.

For example, although the data processing system 500 includes a computer system, it is not limited to the computer system.

It is possible to form a DRAM chip with high integration due to miniaturization using the present invention, and thus it is possible to configure a high-performance data processing system.

As used herein, the following directional terms "forward, rearward, above, downward, vertical, horizontal, below, and transverse" as well as any other similar directional terms refer to those directions of an apparatus equipped with the present invention. Accordingly, these terms, as utilized to describe the present invention should be interpreted relative to an apparatus equipped with the present invention.

The embodiments of methods, software, firmware or codes described above may be implemented by instructions or codes stored on a machine-accessible or machine readable medium. The instructions or codes are executable by a processing element or processing unit. The machine-accessible/readable medium may include, but is not limited to, any mechanisms that provide, store and/or transmit information in a form readable by a machine, such as a computer or electronic system. In some cases, the machine-accessible/readable medium may include, but is not limited to, random-access memories (RAMs), such as static RAM (SRAM) or dynamic RAM (DRAM), read-only memory (ROM), magnetic or optical storage medium and flash memory devices. In other cases, the machine-accessible/readable medium may include, but is not limited to, any mechanism that receives, copies, stores, transmits, or otherwise manipulates electrical, optical, acoustical or other form of propagated signals such as carrier waves, infrared signals, digital signals, including the embodiments of methods, software, firmware or code set forth above.

Furthermore, the particular features, structures, or characteristics may be combined in any suitable manner in one or more embodiments.

The terms of degree such as "substantially," "about," and "approximately" as used herein mean a reasonable amount of deviation of the modified term such that the end result is not significantly changed. For example, these terms can be construed as including a deviation of at least ±5 percents of the modified term if this deviation would not negate the meaning of the word it modifies.

It is apparent that the present invention is not limited to the above embodiments, but may be modified and changed without departing from the scope and spirit of the invention.

What is claimed is:

1. A semiconductor device comprising:
  a semiconductor substrate comprising an isolation region, the semiconductor substrate having a groove in the isolation region;
  a pad electrode in the groove;
  a pad contact plug in the groove, the pad contact plug being disposed on the pad electrode;
  a gate contact plug disposed on the pad contact plug, the gate contact plug being electrically coupled through the pad contact plug to the pad electrode; and
  an insulating side wall in the groove, the insulating side wall covering side surfaces of the pad contact plug and a lower portion of the gate contact plug, and the insulating side wall covering a part of an upper surface of the pad electrode.

2. The semiconductor device according to claim 1, wherein the semiconductor substrate further comprises an active region, the groove including a first groove portion in the active region and a second groove portion in the isolation region.

3. The semiconductor device according to claim 2, further comprising:
  a buried gate electrode in the first groove portion.

4. The semiconductor device according to claim 3, wherein the pad electrode is disposed in the second groove portion, the pad electrode is electrically coupled to the buried gate electrode,
  the pad contact plug is disposed in the second groove portion, the pad contact plug is disposed over the pad electrode, and
  the gate contact plug is disposed over the pad contact plug, the gate contact plug is electrically coupled through the pad contact plug to the pad electrode, the gate contact plug is spatially separated from the pad electrode by the pad contact plug.

5. The semiconductor device according to claim 2, further comprising:
  an inter-layer insulating film over the isolation region,
  wherein the gate contact plug penetrates the inter-layer insulating film, the gate contact plug has a bottom portion which is positioned in an upper portion of the second groove portion.

6. The semiconductor device according to claim 2, further comprising:
  a cap insulating film in the first groove portion, the cap insulating film being disposed on the buried gate electrode.

7. The semiconductor device according to claim 6, wherein the insulating film side wall and the cap insulating film are first and second portions of an insulating film in the groove, respectively.

8. The semiconductor device according to claim 2, wherein the second groove portion has a wider groove portion which is wider than the first groove portion, the pad contact plug and the insulating film side wall are disposed within the wider groove portion.

9. The semiconductor device according to claim 8, wherein the second groove portion has a narrower groove portion which is narrower than the wider groove portion, and the pad electrode has a first thickness in the narrower groove portion and a second thickness in the wider groove portion, and the second thickness is smaller than the first thickness.

10. The semiconductor device according to claim 8, wherein the buried gate electrode extends across the active region, the buried gate electrode reaches the isolation region, and the buried gate electrode has a wider gate electrode portion at its one end in the isolation region, and the wider gate electrode portion is positioned in the wider groove portion.

11. The semiconductor device according to claim 2, further comprising:
a gate insulating film in the first groove portion, the gate insulating film separating the buried gate electrode from the semiconductor substrate.

12. The semiconductor device according to claim 11, further comprising:
source and drain regions in the active region, the source and drain regions being disposed in opposite sides of the buried gate electrode and the gate insulating film.

13. The semiconductor device according to claim 1, wherein the gate contact plug has a bottom portion which is higher in level than a top portion of the pad electrode.

14. The semiconductor device according to claim 1, further comprising:
an interconnect over the inter-layer insulating film, the interconnect being electrically coupled through the gate contact plug to the pad contact plug.

15. The semiconductor device according to claim 1, wherein the pad electrode and the pad contact plug are disposed in a recess unit, and
the gate contact plug is disposed within a gate contact hole of which a portion thereof is defined within the recess unit, the pad contact plug having an upper surface disposed at a bottom surface of the gate contact hole such that the gate contact plug is disposed on the pad contact plug.

* * * * *